(12) United States Patent
Kang et al.

(10) Patent No.: US 11,404,523 B2
(45) Date of Patent: Aug. 2, 2022

(54) DISPLAY DEVICE

(71) Applicant: SAMSUNG DISPLAY CO., LTD., Yongin-si (KR)

(72) Inventors: Kinyeng Kang, Yongin-si (KR); Seungmin Song, Yongin-si (KR); Taehoon Yang, Yongin-si (KR); Sanghoon Lee, Yongin-si (KR); Seonbeom Ji, Yongin-si (KR); Jonghyun Choi, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 182 days.

(21) Appl. No.: 16/922,360

(22) Filed: Jul. 7, 2020

(65) Prior Publication Data

US 2021/0104593 A1  Apr. 8, 2021

(30) Foreign Application Priority Data

Oct. 4, 2019 (KR) .................. 10-2019-0123354

(51) Int. Cl.
*H01L 27/32* (2006.01)
*H01L 27/12* (2006.01)
*H01L 51/52* (2006.01)

(52) U.S. Cl.
CPC ...... *H01L 27/3276* (2013.01); *H01L 27/3272* (2013.01); *H01L 2251/5392* (2013.01)

(58) Field of Classification Search
CPC ............ H01L 27/3276; H01L 27/3272; H01L 27/326; H01L 27/124; H01L 2251/5392
See application file for complete search history.

(56) References Cited

U.S. PATENT DOCUMENTS

| | | |
|---|---|---|
| 9,274,389 B2 | 3/2016 | Kang et al. |
| 10,007,159 B2 | 6/2018 | Lee et al. |
| 10,431,604 B2 | 10/2019 | Cho et al. |
| 2013/0093657 A1 | 4/2013 | Song et al. |
| 2014/0299843 A1 | 10/2014 | Kim |
| 2017/0243898 A1 | 8/2017 | Kim |
| 2018/0074361 A1 | 3/2018 | Chung et al. |
| 2019/0198782 A1* | 6/2019 | Kim .................. H01L 27/1248 |
| 2019/0221584 A1* | 7/2019 | Kang ................ H01L 29/78645 |
| 2019/0296097 A1* | 9/2019 | Hong ................ H01L 27/3258 |
| 2019/0325827 A1* | 10/2019 | Lee .................... H05K 5/0017 |
| 2020/0286417 A1* | 9/2020 | Chae .................... G09G 3/20 |

(Continued)

FOREIGN PATENT DOCUMENTS

CN     108873510 A    11/2018
KR  1020140066930 A    6/2014

(Continued)

OTHER PUBLICATIONS

European Search Report for Application No. 20198078.6 dated Feb. 25, 2021.

*Primary Examiner* — Mohsen Ahmadi
(74) *Attorney, Agent, or Firm* — Cantor Colburn LLP

(57) ABSTRACT

A display device includes a data line extending in a first direction, a scan line extending in a second direction crossing the first direction, a wire extending in the second direction, and a bridge electrically connecting the wire to the data line, where the wire includes a branch protruding from the wire in the first direction, and the bridge overlaps the data line and the branch of the wire.

14 Claims, 32 Drawing Sheets

(56) References Cited

U.S. PATENT DOCUMENTS

| | | | | |
|---|---|---|---|---|
| 2020/0356214 A1* | 11/2020 | Kim | ...................... | G06F 3/0446 |
| 2020/0380920 A1* | 12/2020 | Lee | ...................... | G09G 3/3291 |
| 2021/0019020 A1* | 1/2021 | Hyung | .................... | G06F 3/047 |

FOREIGN PATENT DOCUMENTS

| | | | |
|---|---|---|---|
| KR | 1020180030325 | A | 3/2018 |
| KR | 1020180078478 | A | 7/2018 |
| KR | 101888423 | B1 | 8/2018 |

\* cited by examiner

DISPLAY DEVICE

This application claims priority to Korean Patent Application No. 10-2019-0123354, filed on Oct. 4, 2019, and all the benefits accruing therefrom under 35 U.S.C. § 119, the content of which in its entirety is herein incorporated by reference.

BACKGROUND

1. Field

Exemplary embodiments relate to a display device.

2. Description of Related Art

With a rapid development of display devices for visually representing a variety of electrical signal information, various display devices having excellent characteristics such as slimness, low weight, and low power consumption have been introduced. Furthermore, recently, physical buttons are being removed from a front surface of the display devices, and thus, a dead area of display devices is being reduced, and an area occupied by display areas is being increased.

SUMMARY

Exemplary embodiments include a display device, in which a dead area is reduced and a data signal may be stably transmitted to a pixel.

Technical problems to be solved by the invention are not limited to the above-described technical problems and one of ordinary skill in the art will understand other technical problems from the following description.

Additional inventive features will be set forth in part in the description which follows and, in part, will be apparent from the description, or may be learned by practice of the presented exemplary embodiments of the invention.

An exemplary embodiment of a display device includes a data line extending in a first direction, a scan line extending in a second direction crossing the first direction, a wire extending in the second direction, the wire including a branch protruding from the wire in the first direction, and a bridge for electrically connecting the wire to the data line, where the bridge overlaps the data line and the branch of the wire.

In an exemplary embodiment, the bridge may include a first bridge electrode arranged on a lower layer of the data line and at least partially overlapping the data line, and electrically connected to the data line, and a second bridge electrode arranged in a same layer as the data line and at least partially overlapping the first bridge electrode and the branch of the wire, and electrically connected to the first bridge electrode and the branch of the wire.

In an exemplary embodiment, the display device may further include an inorganic insulating layer between the first bridge electrode and the data line, and an organic insulating layer between the data line and the wire.

In an exemplary embodiment, the display device may further include a power line arranged in parallel with the data line, and including a first power line and a second power line spaced apart from each other.

In an exemplary embodiment, the bridge may be arranged in a gap between the first power line and the second power line.

In an exemplary embodiment, the power line may be arranged in a same layer as the data line.

In an exemplary embodiment, the display device may further include a conductive pattern electrically connecting the first power line to the second power line.

In an exemplary embodiment, the conductive pattern may be arranged in a same layer as the wire.

An exemplary embodiment of the display device includes a data line extending in a first direction, a scan line extending in a second direction crossing the first direction, a wire extending in parallel with the data line or the scan line and including a branch protruding in a direction perpendicular to an extension direction, and a bridge overlapping a part of the wire.

In an exemplary embodiment, the display device may further include a power line arranged in parallel with the data line, and including a first power line and a second power line spaced apart from each other.

In an exemplary embodiment, the bridge may be arranged in a gap between the first power line and the second power line.

In an exemplary embodiment, the power line may be arranged in a same layer as the data line.

In an exemplary embodiment, the display device may further include a conductive pattern electrically connecting the first power line to the second power line.

In an exemplary embodiment, the conductive pattern may be arranged in a same layer as the wire.

In an exemplary embodiment, the bridge may include a first bridge electrode arranged on a lower layer of the data line and at least partially overlapping the data line, and insulated from the data line, and a second bridge electrode arranged in a same layer as the data line and at least partially overlapping the first bridge electrode and the wire, and electrically connected to the first bridge electrode and the wire.

In an exemplary embodiment, the display device may further include an inorganic insulating layer between the first bridge electrode and the data line, and an organic insulating layer between the data line and the wire.

In an exemplary embodiment, the display device may include a bridge electrode arranged in a same layer as the data line and at least partially overlapping the wire, and electrically connected to the wire.

In an exemplary embodiment, the display device may further include an inorganic insulating layer, and an organic insulating layer between the wire and the data line on the inorganic insulating layer.

In an exemplary embodiment, the inorganic insulating layer may include at least one of a hole overlapping the data line and a hole overlapping the bridge electrode.

In an exemplary embodiment, the bridge may overlap the branch protruding from the wire extending in parallel with the scan line or the wire extending in parallel with the data line.

BRIEF DESCRIPTION OF THE DRAWINGS

The above and other features and advantages of exemplary embodiments of the invention will be more apparent from the following description taken in conjunction with the accompanying drawings, in which.

DETAILED DESCRIPTION

Figure 1:
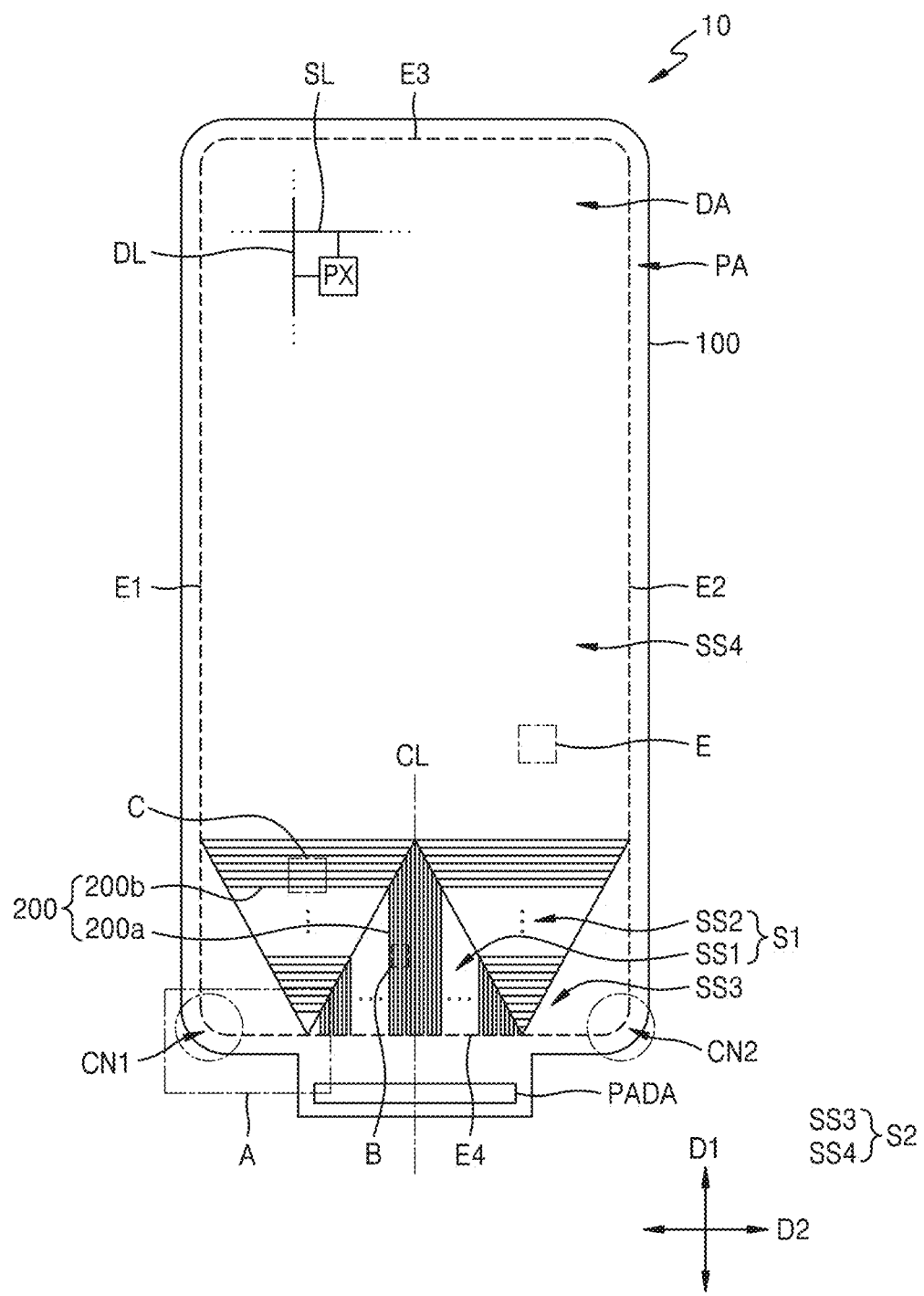
FIG. 1 is a schematic plan view of an exemplary embodiment of a display panel.

Reference will now be made in detail to embodiments, examples of which are illustrated in the accompanying drawings, where like reference numerals refer to like elements throughout. In this regard, the exemplary embodiments may have different forms and should not be construed as being limited to the descriptions set forth herein. Accordingly, the exemplary embodiments are merely described below, by referring to the drawing figures, to explain inventive features of the description. As used herein, the term "and/or" includes any and all combinations of one or more of the associated listed items. Throughout the invention, the expression "at least one of a, b or c" indicates only a, only b, only c, both a and b, both a and c, both b and c, all of a, b, and c, or variations thereof.

In the following description, while such terms as "first," "second," etc. may be used to describe various elements, such elements must not be limited to the above terms. The above terms are used only to distinguish one element from another.

In the following description, an expression used in the singular form encompasses the expression of the plural form, unless it has a clearly different meaning in the context.

In the following description, it will be understood that the terms such as "including," "having," and "comprising" are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

In the following description, it will be understood that when an element, such as a layer, a film, an area, or a plate, is referred to as being "on" another element, the element can be directly on the other element or intervening elements may be present thereon.

Sizes of elements in the drawings may be exaggerated for convenience of explanation. In other words, because sizes and thicknesses of elements in the drawings are arbitrarily illustrated for convenience of explanation, the following exemplary embodiments are not limited thereto.

The expression "A and/or B" indicates only A, only B, or both A and B. Also, the expression "at least one of A and B" includes only A, only B, or both A and B.

In the following exemplary embodiments, when a wire "extends in a first direction or a second direction," it may mean that the wire extends not only in a linear shape but also in a zigzag or curved shape in the first direction or the second direction.

In the following exemplary embodiments, "a plan view of an object" refers to "a view of an object seen from above, and "a cross-sectional view of an object" refers to "a view of an object vertically cut and seen from the side. In the following exemplary embodiments, when elements "overlap," it may mean that the elements overlap in a "plan view" and a "cross-sectional view".

Hereinafter, the invention will be described more fully with reference to the accompanying drawings, in which embodiments of the invention are shown, and in the drawings, the same or corresponding elements are denoted by the same reference numerals.

Figure 2:
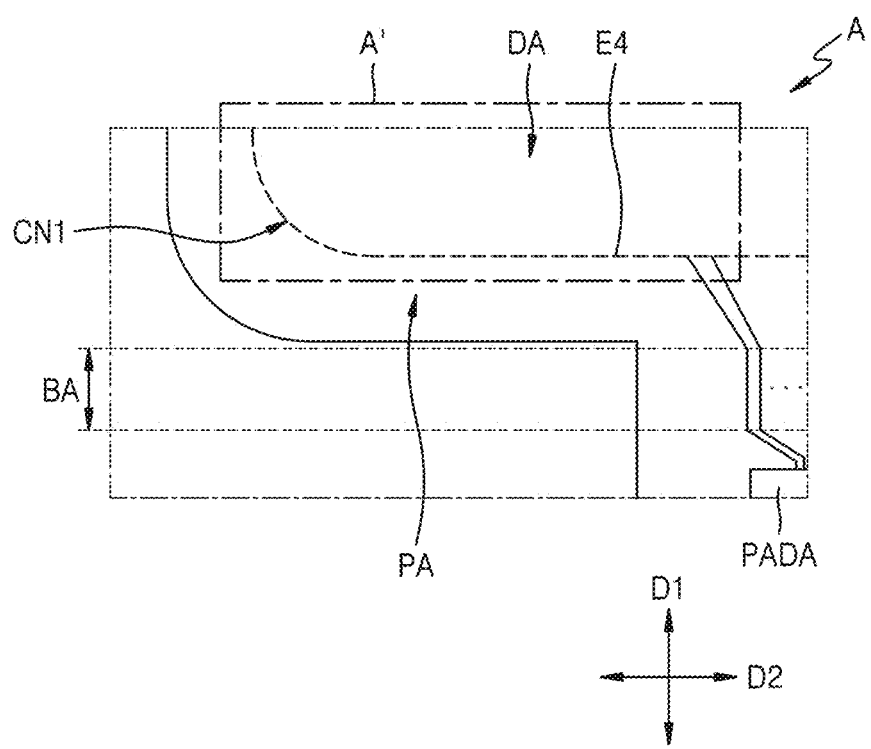
FIG. 2 is a schematic conceptual diagram of area A of FIG. 1.
Figure 3:
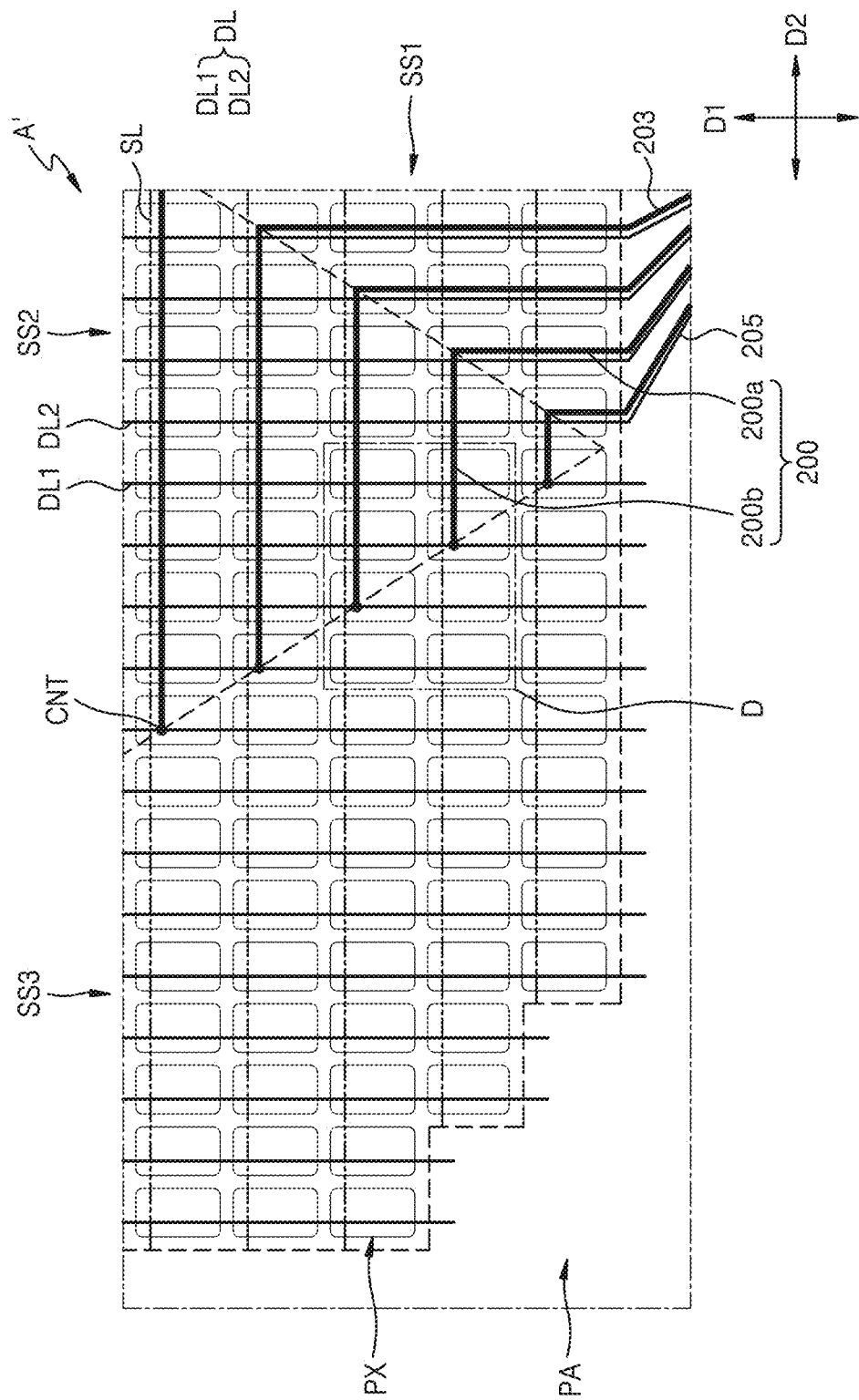
FIG. 3 is a partially enlarged plan view of area A' of FIG. 2.

FIG. 1 is a schematic plan view of an exemplary embodiment of a display panel 10. FIG. 2 is a schematic conceptual diagram of an area A of FIG. 1, and FIG. 3 is a partially enlarged plan view of an area A' of FIG. 2.

Referring to FIG. 1, a display device in an exemplary embodiment may include a display panel 10 including a substrate 100. The display panel 10 may include a display area and a peripheral area disposed outside the display area. The substrate 100 may include a display area DA and a peripheral area PA respectively corresponding to the display area and the peripheral area of the display panel 10.

An edge of the display area DA may have a shape similar to a rectangular shape or a square shape as a whole. As shown in FIGS. 1 and 2, a first corner CN1 of an edge of the display area DA may have a round shape. In detail, the display area DA may include a first edge E1 and a second edge E2 facing each other, and a third edge E3 and a fourth edge E4 disposed between the first edge E1 and the second edge E2 and facing each other. A pad area PADA is adjacent to the fourth edge E4 from among the first edge E1 through the fourth edge E4. In this case, the first corner CN1 having a round shape connects the first edge E1 to the fourth edge E4. A second corner CN2 of the edge of the display area DA may also have a round shape, like the first corner CN1. The second corner CN2 connects the second edge E2 to the fourth edge E4. Also, other portions of the edge of the display area DA may have a round shape.

The peripheral area PA may surround the display area DA. The peripheral area PA where pixels PX are not disposed may include the pad area PADA to which various electronic devices or a printed circuit board are electrically attached, and a voltage line for supplying power for driving a display element may be disposed in the peripheral area PA. A plurality of pads may be provided in the pad area PADA and may be electrically connected to a data driver. In an exemplary embodiment, the data driver that supplies a data signal may be disposed on a film electrically connected to the pads of the pad area PADA by a chip-on-film ("COF") method, for example. In another exemplary embodiment, the data driver may be directly disposed on the substrate 100 by a chip-on-glass ("COG") method or a chip-on-plastic ("COP") method, for example.

FIG. 1 is a plan view illustrating a state of the substrate 100 during a process of manufacturing the display device. In order to reduce a size of the peripheral area PA recognized by a user in the final display device or an electronic device such as a smartphone including the display device, a part of the substrate 100 may be bent.

As shown in FIG. 2, the peripheral area PA may include a bending area BA, and the bending area BA may be disposed between the pad area PADA and the display area DA. In this case, the substrate 100 may be bent in the bending area BA, and at least a part of the pad area PADA may overlap the display area DA. A bending direction is set such that the pad area PADA does not cover the display area DA and is disposed behind the display area DA. Accordingly, the user recognizes that the display area DA occupies the majority of the display device.

FIG. 3 illustrates a part of the first corner CN1. When the user observes the display device according to the illustrated exemplary embodiment or an electronic device including the display device in a normal use environment, the user recognizes that the display device or the electronic device has a round shape, that is, a curved shape. However, in an environment where the first corner CN1 is enlarged and thus wires having a width of several or tens of micrometers may be observed, as shown in FIG. 3, the first corner CN1 may have a linear shape bent multiple times in a first direction D1 and a second direction D2 crossing the first direction D1. Even when the first corner CN1 is enlarged and the first corner CN1 has a linear shape bent multiple times as shown in FIG. 3, the user may recognize, in a normal use environment, that the first corner CN1 has a round shape, that is, a curved shape. Accordingly, when each of the first corner CN1 and the second corner CN2 has a round shape, it may include both a case where each of the first corner CN1 and the second corner CN2 has a substantially round shape and a case where each of the first corner CN1 and the second corner CN2 has a linear shape bent multiple times.

The plurality of pixels PX and signal lines for applying an electrical signal to the plurality of pixels PX may be disposed in the display area DA.

Each of the plurality of pixels PX may include a display element and a pixel circuit for driving the display element. In an exemplary embodiment, the display element may be an organic light-emitting diode, and the pixel circuit may include a plurality of transistors and a capacitor, for example.

The signal lines for applying an electrical signal to the plurality of pixels PX may include a plurality of scan lines SL, a plurality of data lines DL, etc. Each of the plurality of data lines DL may extend in the first direction D1, and each of the plurality of scan lines SL may extend in the second direction D2. The plurality of scan lines SL may be arranged in a plurality of rows and may transfer a scan signal to the pixels PX, and the plurality of data lines DL may be arranged in a plurality of columns and may transfer a data signal to the pixels PX. Each of the plurality of pixels PX may be connected to at least one corresponding scan line SL from among the plurality of scan lines SL and a corresponding data line DL from among the plurality of data lines DL. The data lines DL may include first data lines DL1 and second data lines DL2 as shown in FIG. 3. The first data lines DL1 may be data lines connected to first wires 200 which will be described below. The second data lines DL2 may be data lines other than the first data lines DL1.

Also, the first wires 200 for transferring an electrical signal supplied from the pad area PADA to the signal lines connected to the pixels PX may be disposed in the display area DA. In an exemplary embodiment, the first wires 200 may be connected to the first data lines DL1 and may transfer a data signal supplied from the pad area PADA to the first data lines DL1, for example. The first wires 200 may be disposed in layers different from the scan lines SL and the data lines DL of the pixels PX.

The first wires 200 arranged on the left of a virtual central line CL that substantially passes through a center of the display panel 10 in the second direction D2 and the first wires 200 arranged on the right of the central line CL may be substantially symmetric to each other with reference to the central line CL.

Each of the first wires 200 may include a first portion 200a extending in the first direction D1, and a second portion 200b extending in the second direction D2. The first portion 200a and the second portion 200b may be unitary with one another. The first portion 200a may extend in the first direction D1 from the fourth edge E4 facing the pad area PADA, away from the pad area PADA. The second portion 200b may be bent at the first portion 200a and may extend in the second direction D2 toward the first edge E1 or the second edge E2. The first portion 200a may be close to the central line CL.

The display area DA may be divided into a plurality of areas according to whether the first wires 200 are disposed. In an exemplary embodiment, the display area DA may include a first area S1 where the first wires 200 are disposed and a second area S2 other than the first area S1. The second area S2 may be an area where the first wires 200 are not disposed.

The first area S1 may be divided into a plurality of sub-areas in an extension direction of the first wires 200. In an exemplary embodiment, the first area S1 may include a first sub-area SS1 where the first portions 200a of the first wires 200 are disposed and a second sub-area SS2 where the second portions 200b are disposed, for example. The first sub-area SS1 and the second sub-area SS2 disposed on the right of the central line CL and the first sub-area SS1 and the second sub-area SS2 disposed on the left of the central line CL may be substantially symmetric to each other.

The second area S2 may include at least one third sub-area SS3 facing the first sub-area SS1 of the first area S1 with the second sub-area SS2 of the first area S1 therebetween, and a fourth sub-area SS4 above the second sub-area SS2.

Referring to FIG. 3, the first portion 200a of each of the first wires 200 may be parallel to the second data line DL2, and may partially overlap or be adjacent to the second data line DL2. The first portion 200a of each of the first wires 200 may extend parallel to the second data line DL2 disposed in one of a plurality of columns. The second portion 200b of each of the first wires 200 may be parallel to the scan line SL, and may partially overlap or be adjacent to the scan line SL. The second portion 200b of each of the first wires 200 may extend parallel to the scan line SL disposed in one of a plurality of rows.

As shown in FIG. 3, second wires 203 and third wires 205 may be further disposed in the peripheral area PA.

One end of each of the first wires 200 may be connected to the first data line DL1, and the other end of each of the first wires 200 may be connected to the second wire 203. The second portion 200b of the first wire 200 may be electrically connected to the first data line DL1 at a contact portion CNT.

One end of the second wire 203 may be connected to the other end of the first wire 200, and the other end of the second wire 203 may be connected to the pads of the pad area PADA. In an exemplary embodiment, the second wire 203 may be a portion where the first portion 200a of the first wire 200 extends to the peripheral area PA. In another exemplary embodiment, the second wire 203 that is a separate wire disposed on a layer different from the first wire 200 may be electrically connected to the first portion 200a of the first wire 200 in the peripheral area PA.

One end of the third wire 205 may be connected to the second data line DL2, and the other end of the third wire 205 may be connected to the pads of the pad area PADA. In an exemplary embodiment, the third wire 205 may be a portion where the second data line DL2 extends to the peripheral area PA. In another exemplary embodiment, the third wire 205 that is a separate wire disposed on a layer different from the second data line DL2 may be electrically connected to the second data line DL2 in the peripheral area PA.

Figure 4A:
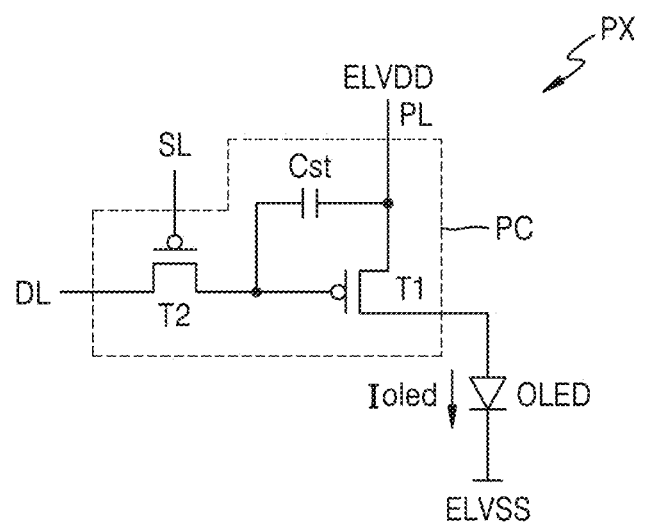
FIGS. 4A and 4B are equivalent circuit diagrams of an exemplary embodiment of one pixel disposed in a display panel.
Figure 4B:
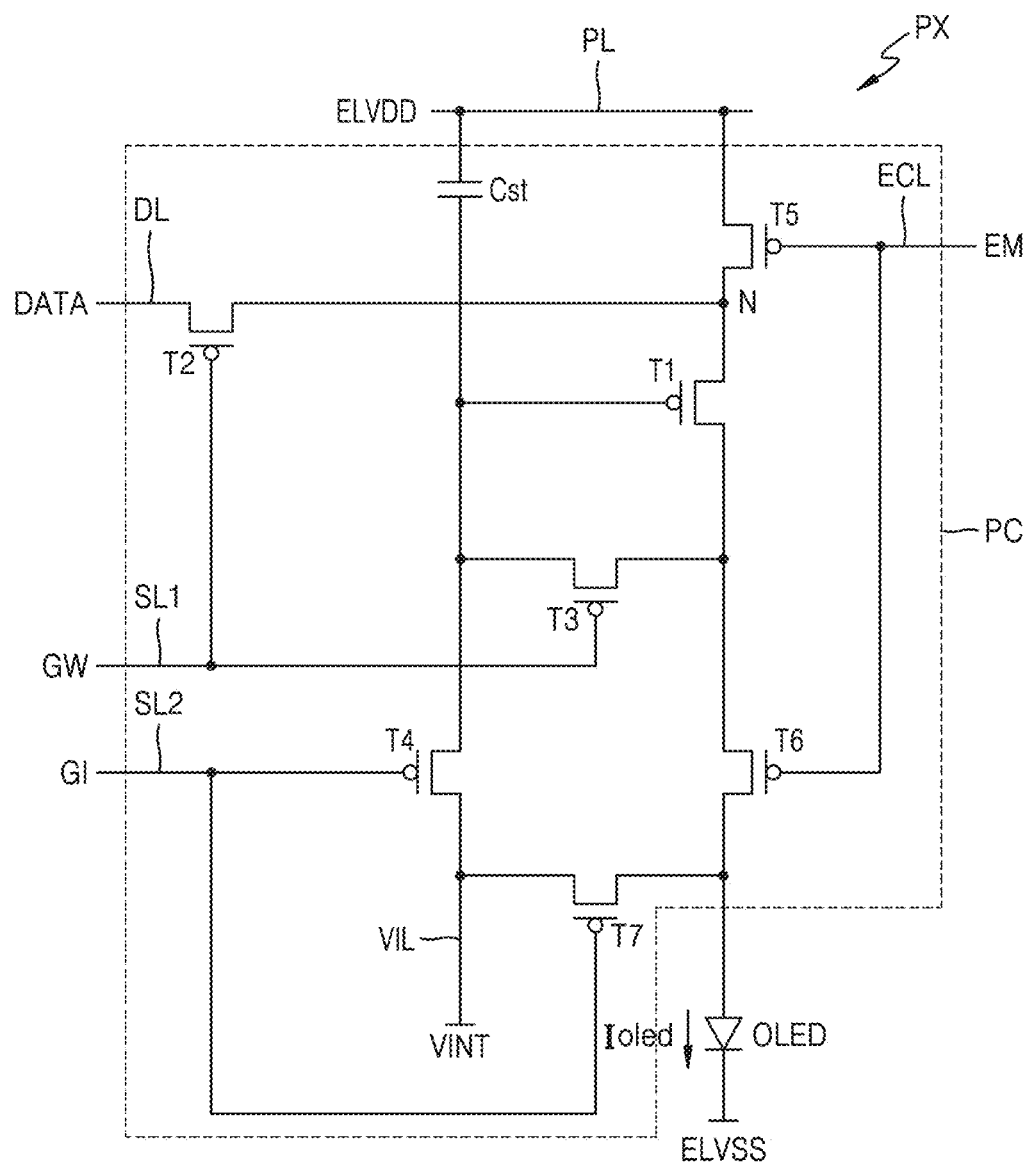

FIGS. 4A and 4B are equivalent circuit diagrams of an exemplary embodiment of one pixel disposed in a display panel 10.

Referring to FIG. 4A, the pixel PX includes a pixel circuit PC and an organic light-emitting diode OLED that is a display element connected to the pixel circuit PC. The pixel circuit PC may include a first transistor T1, a second transistor T2, and a capacitor Cst. Each pixel PX may emit, for example, red, green, blue, or white light from the organic light-emitting diode OLED. The first transistor T1 and the second transistor T2 may be implemented as thin-film transistors.

The second transistor T2 that is a switching transistor may be connected to the scan line SL and the data line DL and may transfer a data signal input from the data line DL to the first transistor T1 according to a switching voltage input from the scan line SL. The capacitor Cst may be connected to the second transistor T2 and a power voltage line PL and may store a voltage corresponding to a difference between a voltage corresponding to a data signal received from the second transistor T2 and a first power voltage ELVDD supplied to the power voltage line PL. The power voltage line PL may be spaced apart from the scan line SL or the data line DL to be parallel to the scan line SL or the data line DL.

The first transistor T1 that is a driving transistor may be connected to the power voltage line PL and the capacitor Cst, and may control a driving current flowing through the organic light-emitting diode OLED from the power voltage line PL in response to a value of a voltage stored in the capacitor Cst. The organic light-emitting diode OLED may include a pixel electrode and a counter electrode, and the counter electrode may receive a second power voltage ELVSS. The organic light-emitting diode OLED receives a driving current $I_{oled}$ from the first transistor T1 and emits light to display an image.

FIG. 4A illustrates that the pixel circuit PC includes two transistors and one capacitor. In another exemplary embodiment, the number of transistors and the number of capacitors may be modified in various ways according to a design of the pixel circuit PC.

Referring to FIG. 4B, each pixel PX includes signal lines (a first scan line SL1, a second scan line SL2, an emission control line ECL, and a data line DL), an initialization voltage line VIL, and the power voltage line PL. In another exemplary embodiment, at least one of the signal lines (the first scan line SL1, the second scan line SL2, the emission control line ECL, and the data line DL), the initialization voltage line VIL, and/or the power voltage line PL may be shared by neighboring pixels.

The signal lines include the first scan line SL1 which transfers a first scan signal GW, the second scan line SL2 which transfers a second scan signal GI, the emission control line ECL which transfers an emission control signal EM, and the data line DL that crosses the first scan line SL1 and transfers a data signal DATA. The second scan line SL2 may be connected to the first scan line SL1 of a next row or a previous row, and the second scan signal GI may be a first scan signal GW of the next row or the previous row.

The power voltage line PL transfers the first power voltage ELVDD to the first transistor T1, and the initialization voltage line VIL transfers, to the pixel PX, an initialization voltage VINT for initializing the first transistor T1 and the organic light-emitting diode OLED.

The first scan line SL1, the second scan line SL2, the emission control line ECL, and the initialization voltage line VIL may extend in the second direction D2 and may be spaced apart from one another in each row. The data line DL and the power voltage line PL may extend in the first direction D1 and may be spaced apart from each other in each column.

The pixel circuit PC of the pixel PX may include first through seventh transistors T1 through T7 and the capacitor Cst. The first through seventh transistors T1 through T7 may be implemented as thin-film transistors.

The first transistor T1 is connected to the power voltage line PL via the fifth transistor T5 and is electrically connected to the organic light-emitting diode OLED via the sixth transistor T6. The first transistor T1 that functions as a driving transistor receives the data signal DATA according to a switching operation of the second transistor T2 to supply the driving current $I_{oled}$ to the organic light-emitting diode OLED.

The second transistor T2 is connected to the first scan line SL1 and the data line DL, and is turned on according to the first scan signal GW received through the first scan line SL1 to perform a switching operation of transmitting a data signal DATA transmitted to the data line DL, to a node N.

The third transistor T3 is connected to the organic light-emitting diode OLED via the sixth transistor T6. The third transistor T3 is turned on according to the first scan signal GW received through the first scan line SL1 to diode-connect the first transistor T1.

The fourth transistor T4 is turned on according to the second scan signal GI received through the second scan line SL2 to initialize a gate voltage of the first transistor T1 by transmitting the initialization voltage VINT from the initialization voltage line VIL to a gate electrode of the first transistor T1.

The fifth transistor T5 and the sixth transistor T6 are simultaneously turned on according to the emission control signal EM received through the emission control line ECL, to form a current path through which the driving current $I_{oled}$ may flow from the power voltage line PL to the organic light-emitting diode OLED.

The seventh transistor T7 is turned on according to the second scan signal GI received through the second scan line SL2 to initialize the organic light-emitting diode OLED by transmitting the initialization voltage VINT from the initialization voltage line VIL to the organic light-emitting diode OLED. In another exemplary embodiment, the seventh transistor T7 may be omitted.

FIG. 4B illustrates that the fourth transistor T4 and the seventh transistor T7 are connected to the second scan line SL2. In another exemplary embodiment, the fourth transistor T4 may be connected to the second scan line SL2, and the seventh transistor T7 may be connected to a separate wire and driven according to a signal transferred to the wire.

The capacitor Cst may be connected to the gate electrode of the first transistor T1 and the power voltage line PL and may store and maintain a voltage corresponding to a difference between voltages at both ends, thereby maintaining a voltage applied to the gate electrode of the first transistor T1.

The organic light-emitting diode OLED may include a pixel electrode and a counter electrode, and the counter electrode may receive a second power voltage ELVSS. The organic light-emitting diode OLED receives a driving current Ioled from the first transistor T1 and emits light to display an image.

Figure 5:
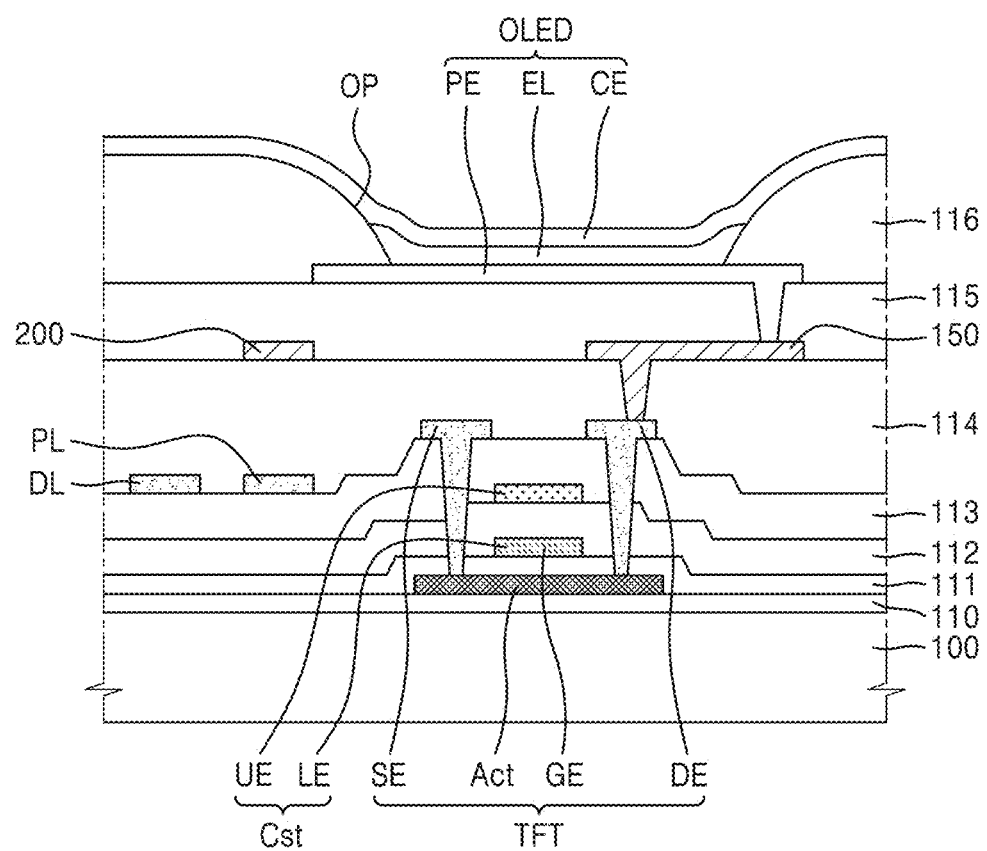
FIG. 5 is a partial cross-sectional view of a display panel.

FIG. 5 is a partial cross-sectional view of an exemplary embodiment of a display panel 10. FIG. 5 illustrates a stacked relationship of elements included in a pixel arranged in a display area of a substrate 100 and wires connected to the pixel.

The substrate 100 may include any of various materials such as a glass material, a metal material, or a plastic material. In an exemplary embodiment, the substrate 100 may be a flexible substrate and may include, for example, a polymer resin such as polyethersulfone ("PES"), polyacrylate, polyetherimide ("PEI"), polyethylene naphthalate ("PEN"), polyethylene terephthalate ("PET"), polyphenylene sulfide ("PPS"), polyarylate ("PAR"), polyimide ("PI"), polycarbonate ("PC"), or cellulose acetate propionate ("CAP"). The substrate 100 may have a multilayer structure including a layer including the polymer resin described above and an inorganic layer (not shown). A buffer layer 110 may be disposed on the substrate 100.

The buffer layer 110 may have a single-layer or multi-layer structure including an inorganic insulating material such as silicon oxide, silicon nitride, or silicon oxynitride. A barrier layer (not shown) for preventing penetration of external air may be further provided between the substrate 100 and the buffer layer 110. In another exemplary embodiment, the buffer layer 110 may be omitted.

A thin-film transistor TFT may be disposed on the buffer layer 110. The thin-film transistor TFT may include a semiconductor layer Act, a gate electrode GE, a source electrode SE, and a drain electrode DE.

The semiconductor layer Act may include amorphous silicon, polycrystalline silicon, or an organic semiconductor material. The semiconductor layer Act may include a source area, a drain area, and a channel area between the source area and the drain area. A first insulating layer 111 may be disposed on the semiconductor layer Act.

The gate electrode GE may have a single-layer or multi-layer structure including at least one material from among, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), considering adhesion to an adjacent layer, surface flatness of a layer to be stacked thereon, and processability. A second insulating layer 112 may be disposed on the gate electrode GE.

The source electrode SE and the drain electrode DE may have a single-layer or multi-layer structure including at least one material from among, for example, Al, Pt, Pd, Ag, Mg, Au, Ni, Nd, Ir, Cr, Li, Ca, Mo, Ti, W, and Cu. The source electrode SE and the drain electrode DE may be respectively electrically connected to the source area and the drain area of the semiconductor layer Act through contact holes defined in the first insulating layer 111, the second insulating layer 112, and a third insulating layer 113.

The capacitor Cst includes a lower electrode LE and an upper electrode UE overlapping each other with the second insulating layer 112 therebetween. The capacitor Cst may overlap the thin-film transistor TFT. FIG. 5 illustrates that the gate electrode GE of the thin-film transistor TFT is the lower electrode LE of the capacitor Cst. In another exemplary embodiment, the capacitor Cst may not overlap the thin-film transistor TFT, and the lower electrode LE of the capacitor Cst may be an element independent of the gate electrode GE of the thin-film transistor TFT. The upper electrode UE of the capacitor Cst may have a single-layer or multi-layer structure including at least one material from among Al, Pt, Pd, Ag, Mg, Au, Ni, Nd, Ir, Cr, Li, Ca, Mo, Ti, W, and Cu. The capacitor Cst may be covered by the third insulating layer 113.

Each of the first insulating layer 111, the second insulating layer 112, and the third insulating layer 113 may be an inorganic insulating layer including an inorganic material such as silicon oxide, silicon nitride, and/or silicon oxynitride.

Various conductive layers may be further disposed on the third insulating layer 113. In an exemplary embodiment, the data line DL and the power voltage line PL may be disposed on the third insulating layer 113, that is, in the same layer as the source electrode SE and the drain electrode DE, for example. Each of the data line DL and the power voltage line PL may include Mo, Al, Cu, Ti, etc., and may have a single-layer or multi-layer structure. In an exemplary embodiment, each of the data line DL and the power voltage line PL may have a multi-layer structure including Ti/Al/Ti.

A fourth insulating layer 114 may be disposed on the data line DL and the power voltage line PL.

The first wire 200 may be disposed on the fourth insulating layer 114. The first wire 200 may have a single-layer or multi-layer structure including at least one from among Mo, Al, Cu, Ti, and an alloy thereof. In an exemplary embodiment, the first wire 200 may have a multi-layer structure including Ti/Al/Ti.

A connection member 150 for electrically connecting the thin-film transistor TFT to the organic light-emitting diode OLED may be further disposed on the fourth insulating layer 114. The connection member 150 may have a single-layer or multi-layer structure including at least one from among Mo, Al, Cu, Ti, and an alloy thereof. In an exemplary embodiment, the connection member 150 may have a multi-layer structure including Ti/Al/Ti.

A fifth insulating layer 115 may be disposed on the first wire 200 and the connection member 150.

Each of the fourth insulating layer 114 and the fifth insulating layer 115 that is a planarization insulating layer may be an organic insulating layer. Each of the fourth insulating layer 114 and the fifth insulating layer 115 may include an organic insulating material such as a general-purpose polymer (e.g., polymethyl methacrylate ("PMMA") or polystyrene ("PS")), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof. In an exemplary embodiment, each of the fourth insulating layer 114 and the fifth insulating layer 115 may include polyimide ("PI").

The organic light-emitting diode OLED that is a display element may be disposed on the fifth insulating layer 115. The organic light-emitting diode OLED may include a pixel electrode PE, an intermediate layer EL, and a counter electrode CE.

The pixel electrode PE may be disposed on the fifth insulating layer 115, and may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another exemplary embodiment, the pixel electrode PE may include a reflective film including Ag, Mg, Al, Pt, Pd, Au, Ni, Nd, Ir, Cr, or a combination thereof. In another exemplary embodiment, the pixel electrode PE may further include a film including ITO, IZO, ZnO, or $In_2O_3$ over/under the reflective film. The pixel electrode PE may be electrically connected to the source electrode SE or the drain electrode DE of the thin-film transistor TFT through the connection member 150 on the fourth insulating layer 114.

A sixth insulating layer 116 may be disposed on the fifth insulating layer 115. The sixth insulating layer 116 may function as a pixel-defining layer by defining an opening that corresponds to each pixel, that is, an opening OP through which a part of the pixel electrode PE is exposed. The sixth insulating layer 116 may include an organic material such as acryl, benzocyclobutene ("BCB"), PI, or hexamethyldisiloxane ("HMDSO"). In an alternative exemplary embodiment, the sixth insulating layer 116 may include the above inorganic material.

The intermediate layer EL may be disposed on the pixel electrode PE exposed by the opening OP of the sixth insulating layer 116. The intermediate layer EL includes an emission layer. The emission layer may include a polymer organic material or a low molecular weight organic material that emits light of a predetermined color. In an exemplary embodiment, the emission layer may be a red emission layer, a green emission layer, or a blue emission layer, for example. In an alternative exemplary embodiment, the emission layer may have a multi-layer structure in which a red emission layer, a green emission layer, and a blue emission layer are stacked to emit white light, or a single-layer structure including a red emission material, a green emission material, and a blue emission material. In an exemplary embodiment, the intermediate layer EL may include a first functional layer disposed under the emission layer and/or a second functional layer disposed over the emission layer. The first functional layer and/or the second functional layer may include a layer that is unitary over the plurality of pixel electrodes PE, or may include layers patterned to respectively correspond to each of the plurality of pixel electrodes PE.

The first functional layer may have a single-layer or multi-layer structure. In an exemplary embodiment, when the first functional layer includes a polymer material, the first functional layer that is a hole transport layer ("HTL") having a single-layer structure may include poly(3,4-ethylenedioxythiophene) ("PEDOT") or polyaniline ("PANI"), for example. When the first functional layer includes a low molecular weight material, the first functional layer may include a hole injection layer ("HIL") and an HTL.

In another exemplary embodiment, the second functional layer may be omitted. In an exemplary embodiment, when each of the first functional layer and the emission layer includes a polymer material, it is preferable that the second functional layer is provided to improve the characteristics of the organic light-emitting diode OLED. The second functional layer may have a single-layer or multi-layer structure. The second functional layer may include an electron transport layer ("ETL") and/or an electron injection layer ("EIL").

The counter electrode CE faces the pixel electrode PE with the intermediate layer EL therebetween. The counter electrode CE may include a conductive material having a low work function. In an exemplary embodiment, the counter electrode CE may include a (semi)transparent layer including Ag, Mg, Al, Pt, Pd, Au, Ni, Nd, Ir, Cr, Li, Ca, or an alloy thereof. In an alternative exemplary embodiment, the counter electrode CE may further include a layer including ITO, IZO, ZnO, or $In_2O_3$ on the (semi)transparent layer including the above material. The counter electrode CE may be disposed on the intermediate layer EL and the sixth insulating layer 116. The counter electrode CE may be a common electrode unitary with a plurality of organic light-emitting diodes OLED in the display area DA and facing the plurality of pixel electrodes PE.

Figure 6:
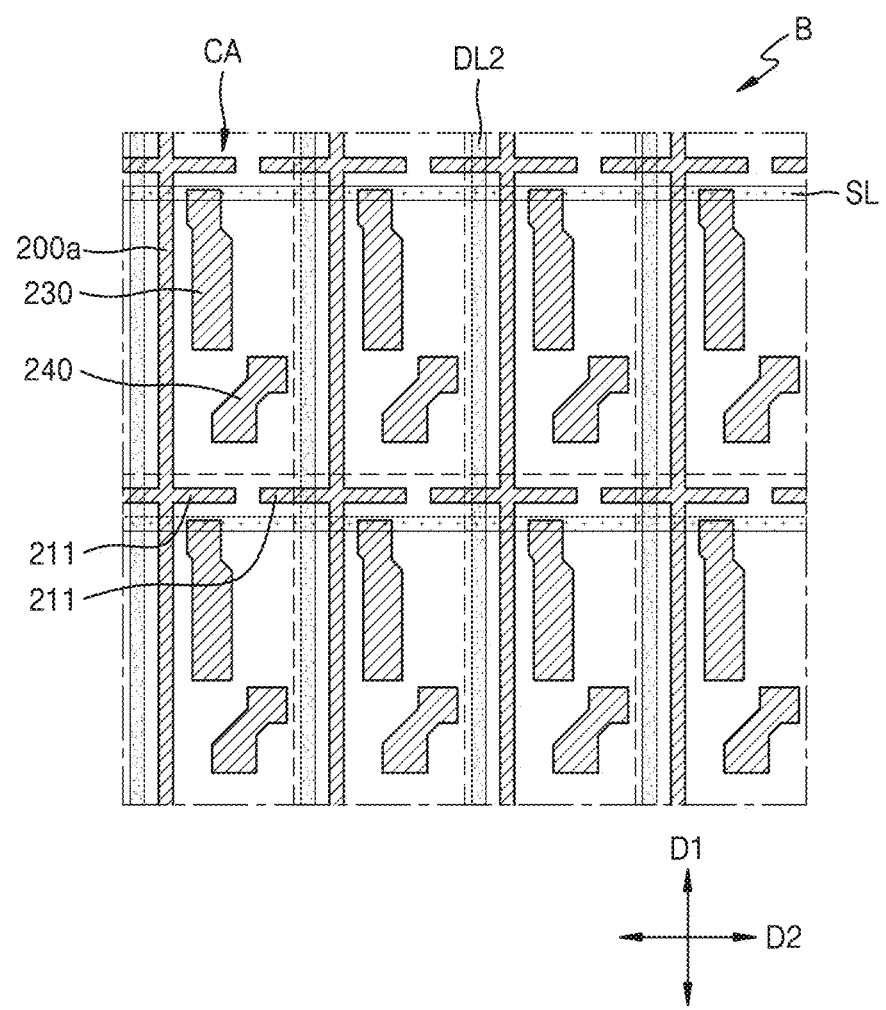
FIGS. 6 through 8 are schematic plan views of an exemplary embodiment of a first wire.
Figure 7:
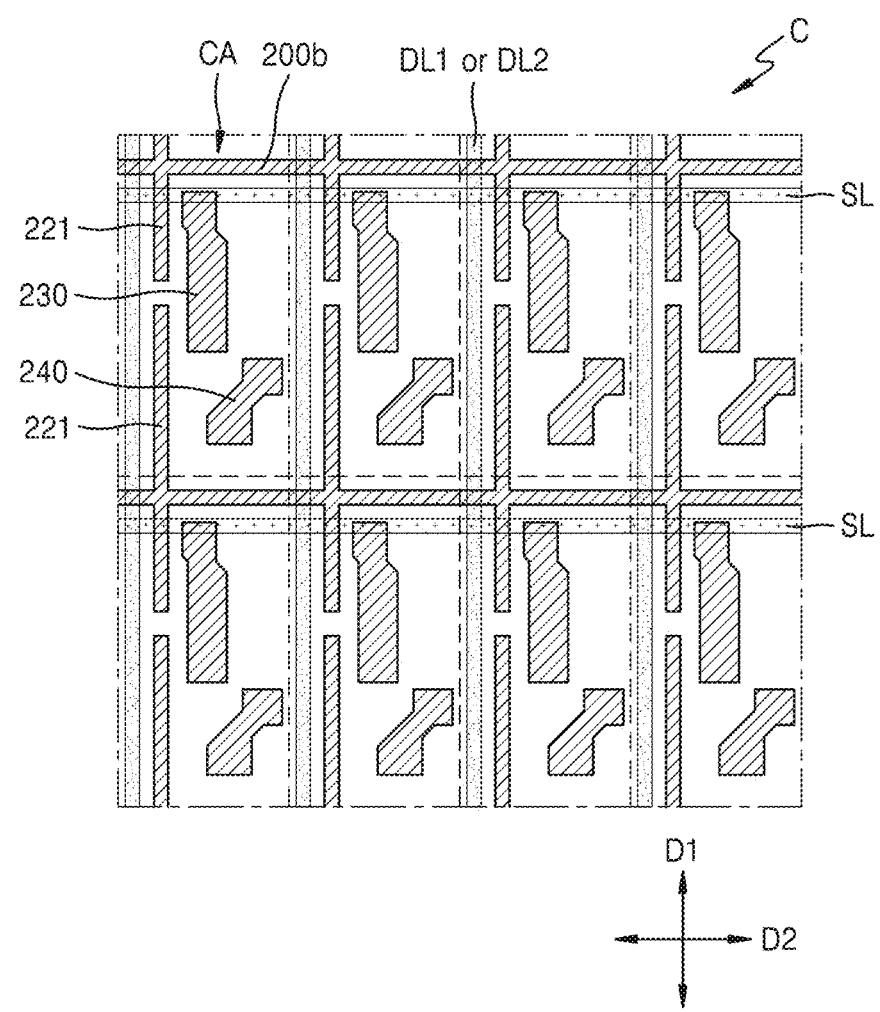
Figure 8:
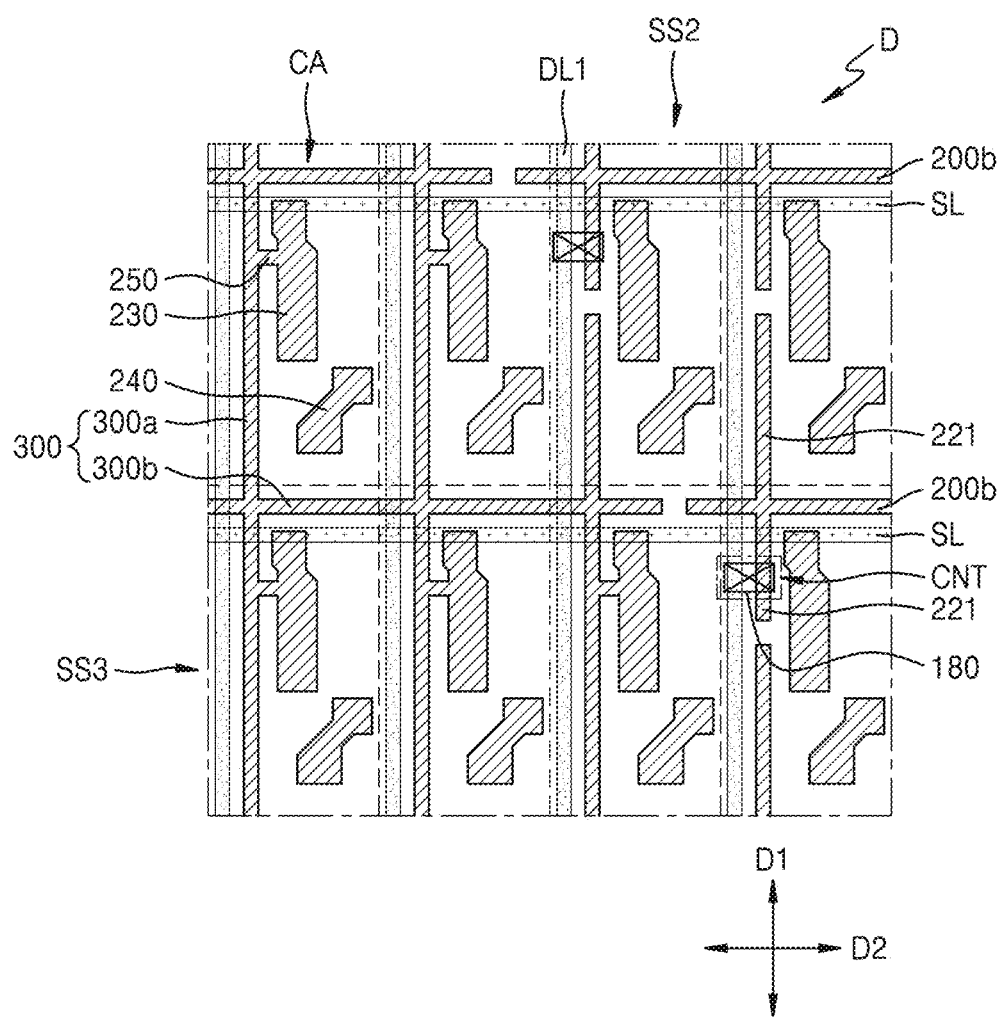
Figure 9:
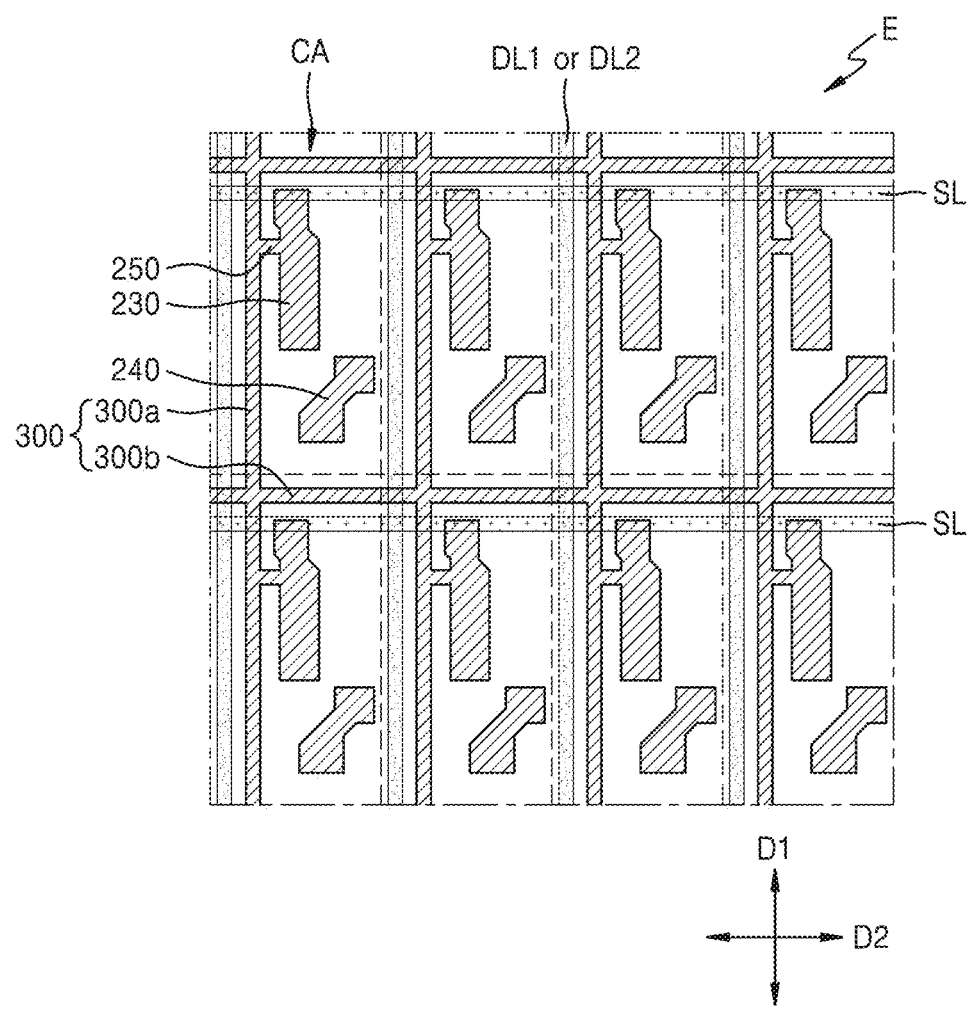
FIG. 9 is a schematic plan view of an exemplary embodiment of a fourth wire.

FIGS. 6 through 8 are schematic plan views of an exemplary embodiment of a first wire 200. FIG. 6 is a partially enlarged plan view of an area B of FIG. 1, FIG. 7 is a partially enlarged plan view of an area C of FIG. 1, and FIG. 8 is a partially enlarged plan view of an area D of FIG. 3. FIG. 9 is a schematic plan view of an exemplary embodiment of a fourth wire 300.

Although the first wires 200 arranged on the left of the central line CL are illustrated in FIGS. 6 and 7, the same description may apply to the first wires 200 arranged on the right of the central line CL. In FIGS. 6 through 9, a pixel area CA where pixels are arranged is defined by a dotted line.

Referring to FIG. 6, in the first sub-area SS1, the first portion 200a of the first wires 200 may extend in a direction parallel to the first direction D1, and the first portion 200a may include first branches 211 protruding in the second direction D2.

The first branches 211 may symmetrically protrude from the first portion 200a about the first portion 200a of the first wire 200. That is, the first branches 211 may protrude in both directions along the second direction D2 from the first portion 200a of the first wire 200 extending in the first direction D1. Also, one pair of the first branches 211 protruding toward each other from two adjacent first portions 200a from among the first portions 200a that are arranged parallel to one another in the first sub-area SS1 may be disposed on the same line. In order to prevent a short circuit between the first wires 200, end portions of the first branches 211 extending toward each other from the two adjacent first portions 200a may be spaced apart from each other to define a gap. In the first sub-area SS1, the first portions 200a and the first branches 211 may be arranged in the pixel area CA in a predetermined pattern.

Referring to FIG. 7, in the second sub-area SS2, the second portion 200b of the first wires 200 may extend in a direction parallel to the second direction D2, and the second portion 200b may include second branches 221 protruding in the first direction D1.

The second branches 221 may protrude from the second portion 200b about the second portion 200b of the first wire 200. That is, the second branches 221 may protrude in both directions along the first direction D1 from the second portion 200b of the first wire 200 extending in the second direction D2. Also, one pair of the second branches 221 protruding toward each other from two adjacent second portions 200b in the second sub-area SS2 may be disposed on the same line. In order to prevent a short circuit between the first wires 200, end portions of the second branches extending toward each other from the two adjacent second portions 200b may be spaced apart from each other to define a gap. In the second sub-area SS2, the second portions 200b and the second branches 221 may be arranged in the pixel area CA in a predetermined pattern.

Referring to FIG. 8, the second portion 200b of the first wire 200 may be electrically connected to the first data line DL1 by a first bridge 180 at the contact portion CNT. The contact portion CNT may be disposed in a boundary between the second sub-area SS2 of the first area S1 and the third sub-area SS3 of the second area S2.

In the second area S2, a fourth wire 300 may be disposed in the same layer as the first wire 200. The fourth wire 300 may include the same material as that of the first wire 200. FIG. 8 illustrates the fourth wire 300 disposed in the third sub-area SS3 of the second area S2. As shown in FIG. 9, the fourth wire 300 may also be disposed in the fourth sub-area SS4 of the second area S2. FIG. 9 is a partially enlarged plan view of an area E of FIG. 1, that is, the fourth sub-area SS4 of the second area S2.

Referring to FIGS. 8 and 9, the fourth wire 300 may be spaced apart from the first wires 200 and may be electrically separated. The fourth wire 300 may include a plurality of first portions 300a extending in the first direction D1 and spaced apart from each other, and a plurality of second portions 300b extending in the second direction D2, crossing the first portions 300a, and spaced apart from each other. The fourth wire 300 may have a grid structure (mesh structure) in which the plurality of first portions 300a and the plurality of second portions 300b are connected to each other. In the second area S2, the fourth wire 300 may be arranged in the pixel area CA in a predetermined pattern. Because the second area S2 includes the fourth wire 300, the first area S1 and the second area S2 where the first wires 200 are disposed may be effectively prevented from being distinguishably seen. The fourth wire 300 disposed in the third sub-area SS3 and the fourth wire 300 disposed in the fourth sub-area SS4 may partially be physically and/or electrically connected to each other in an exemplary embodiment, and may also be separated from each other in another exemplary embodiment.

As shown in FIGS. 6 through 9, in each pixel area CA, a plurality of conductive patterns may be further disposed in the same layer as the first wires 200 and the fourth wire 300. The conductive patterns may include first patterns 230. Each of the first patterns 230 may function as a shielding electrode for preventing signal interference between a pixel circuit disposed on a lower layer of the first pattern 230 and a pixel electrode disposed on an upper layer of the first pattern 230 in the pixel area CA. The first pattern 230 may be electrically connected to the power voltage line PL connected to the pixel PX and may receive the first power voltage ELVDD. The conductive patterns may further include second patterns 240. Each of the second patterns 240 may function as a bridge electrode for connecting a pixel circuit disposed on a lower layer of the second pattern 240 to a pixel electrode disposed on an upper layer of the second pattern 240 in the pixel area CA. In an exemplary embodiment, the second pattern 240 may be an exemplary embodiment of the connection member 150 shown in FIG. 5, for example.

As shown in FIGS. 6 through 8, in the pixel areas CA of the first area S1, that is, the pixel areas CA where the first wires 200 are arranged, the first patterns 230 may be physically and electrically separated from the first wires 200.

In contrast, as shown in FIGS. 8 and 9, in the pixel areas CA of the second area S2, the first patterns 230 may be electrically connected to the fourth wire 300 by a bridge 250. In an exemplary embodiment, the fourth wire 300, the first patterns 230, and the bridge 250 disposed in the pixel areas CA of the second area S2 may be unitary. The fourth wire 300 disposed in the pixel areas CA of the second area S2 may receive the first power voltage ELVDD through the first pattern 230 electrically connected to the power voltage line PL. Because the first patterns 230 and the second patterns 240 are included in the first area S1 and the second area S2, the pattern density may be ensured, thereby providing advantages in a manufacturing process.

FIGS. 8 and 9 illustrate an exemplary embodiment of a grid structure in which the first portions 300a and the second portions 300b of the fourth wire 300 disposed in the second area S2 are connected to each other. However, in another exemplary embodiment, similar to the second portions 200b of the first wire 200 shown in FIG. 7, the second portions 300b of the fourth wire 300 may extend in the second direction D2, may be spaced apart from each other, and may include branches protruding from the second portions 300b in the first direction D1.

Figure 10A:
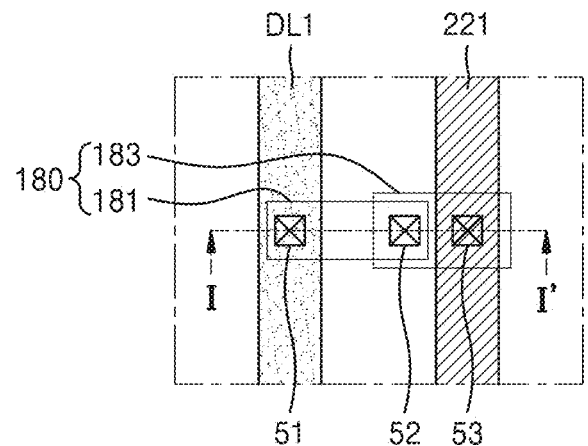
FIGS. 10A and 10B are respectively an enlarged plan view and a cross-sectional view of a contact portion in FIG. 8.
Figure 10B:
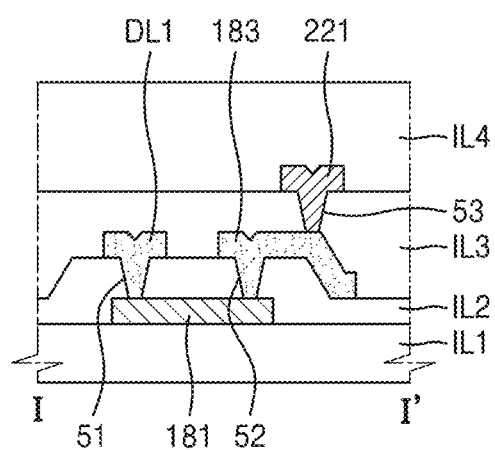
Figure 11:
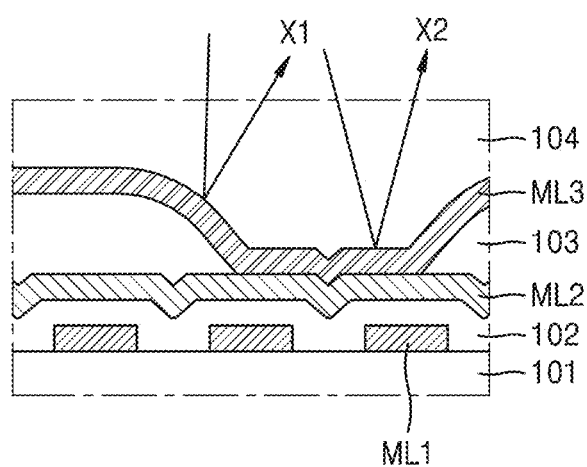
FIG. 11 is a comparative example diagram illustrating a structure of the contact portion in FIGS. 10A and 10B.

FIGS. 10A and 10B are respectively an enlarged plan view and a cross-sectional view of the contact portion CNT in FIG. 8. FIG. 11 is a comparative example diagram illustrating a structure of the contact portion CNT in FIG. 10. FIG. 10A is a plan view of the contact portion CNT, and FIG. 10B is a cross-sectional view of the contact portion CNT taken along line I-I'.

Hereinafter, for convenience of explanation, in the first area S1, the pixel area CA where the contact portion CNT, in which the first wire 200 contacts the first data line DL1, is disposed is referred to as a first pixel area CA1 (refer to FIG. 12), and the other pixel area CA is referred to as a second pixel area CA2 (refer to FIG. 12). The pixel area CA of the second area S2 is referred to as a third pixel area CA3 (refer to FIG. 12).

Referring to FIG. 10, in the first pixel areas CA1, the first wire 200 may be electrically connected to the first data line DL1 by the first bridge 180. The first bridge 180 may electrically connect the second branch 221 of the first wire 200 to the first data line DL1. The first bridge 180 may include at least two conductive patterns on different layers to electrically connect the second branch 221 of the first wire 200 to the first data line DL1. The first bridge 180 may include a first bridge electrode 181 and a second bridge electrode 183. The first wire 200 and the first data line DL1 may be electrically connected not by directly contacting each other, but rather by a double bridge structure using the first bridge electrode 181 and the second bridge electrode 183.

Referring to the plan view and the cross-sectional view, the first bridge electrode 181 may be arranged on an insulating layer IL1, and the second bridge electrode 183 may be arranged on an insulating layer IL2 on the insulating layer IL1. The first data line DL1 may be arranged on the insulating layer IL2, and the first wire 200, that is, the second branch 221 of the first wire 200 may be arranged on an insulating layer IL3 on the insulating layer IL2. The first data line DL1 may at least partially overlap the first bridge electrode 181, and may contact the first bridge electrode 181 via a contact hole 51 of the insulating layer IL2. The second bridge electrode 183 may at least partially overlap the first bridge electrode 181, and may contact the first bridge electrode 181 via a contact hole 52 of the insulating layer IL2. The second branch 221 of the first wire 200 may at least partially overlap the second bridge electrode 183, and may contact the second bridge electrode 183 via a contact hole 53 of the insulating layer IL3. In FIG. 10, the contact hole 52 of the insulating layer IL2 does not overlap the contact hole 53 of the insulating layer IL3, but, in another exemplary embodiment, the contact hole 52 of the insulating layer IL2 may overlap the contact hole 53 of the insulating layer IL3. The first wire 200 may be covered with an insulating layer IL4 which is a planarization layer. The insulating layer IL1 and the insulating layer IL2 may be inorganic insulating layers, and the insulating layer IL3 and the insulating layer IL4 may be organic insulating layers.

In an exemplary embodiment, the first bridge electrode 181 may be arranged in the same layer as the gate electrode GE of the thin-film transistor TFT shown in FIG. 5. The first bridge electrode 181 may include the same material as that of the gate electrode GE. In this case, the insulating layer IL1 may be the first insulating layer 111 shown in FIG. 5, and the insulating layer IL2 may have a structure in which the second insulating layer 112 and the third insulating layer 113 shown in FIG. 5 are stacked. In another exemplary embodiment, the first bridge electrode 181 may be arranged in the same layer as the upper electrode UE of the capacitor Cst shown in FIG. 5. The first bridge electrode 181 may include the same material as that of the upper electrode UE. In this case, the insulating layer IL1 may be the second insulating layer 112 shown in FIG. 5, and the insulating layer IL2 may be the third insulating layer 113 shown in FIG. 5.

The second bridge electrode 183 may be arranged in the same layer as the first data line DL1. The second bridge electrode 183 may include the same material as that of the first data line DL1. The insulating layer IL3 may be the fourth insulating layer 114 shown in FIG. 5, and the insulating layer IL4 may be the fifth insulating layer 115 shown in FIG. 5.

Referring to the comparative example diagram of FIG. 11, a first conductive layer ML1 is arranged between inorganic insulating layers 101 and 102, and a second conductive layer ML2 is arranged on the inorganic insulating layer 102 covering the first conductive layer ME. An organic insulating layer 103 is arranged on the second conductive layer ML2, and a third conductive layer ML3 is arranged on the organic insulating layer 103. An organic insulating layer 104 is arranged on the third conductive layer ML3. The organic insulating layers 103 and 104 which are planarization layers are relatively thicker than the inorganic insulating layers 101 and 102. When the second conductive layer ML2 and the third conductive layer ML3 arranged with the organic insulating layer 103 therebetween contact each other while overlapping each other, the third conductive layer ML3 is not planarized. Accordingly, metal reflection characteristics X1 and X2 of external light by the third conductive layer ML3 are changed according to the position, such that an area where the second conductive layer ML2 and the third conductive layer ML3 contact each other may be viewed by the user.

In an exemplary embodiment, as shown in FIG. 8, the contact portion CNT to which the first data line DL1 and the first wire 200 arranged with the organic insulating layer therebetween are electrically connected may be disposed only in the first pixel areas CA1 of the entire pixel areas CA. In this case, as shown in FIG. 10, in the first pixel areas CA1, the first wire 200 and the first data line DL1 are electrically connected at a lower layer of the organic insulating layers IL3 and IL4 by the first bridge 180 without overlapping the first wire 200 with the first data line DL1. Accordingly, in the first pixel areas CA1, a part where the first data line DL1 and the first bridge electrode 181 of the first bridge 180 are electrically connected while overlapping each other may be planarized by the organic insulating layers 113 and 114. That is, in an exemplary embodiment, in the first pixel area CA1, the first wire 200 is not directly contacted with the first data line DL1 by overlapping the first wire 200 with the first data line DL1, and thus, in the first area S1, the first pixel areas CA1 with the contact portion CNT and the second pixel areas CA2 without the contact portion CNT may be prevented from being distinguishably seen.

Figure 12:
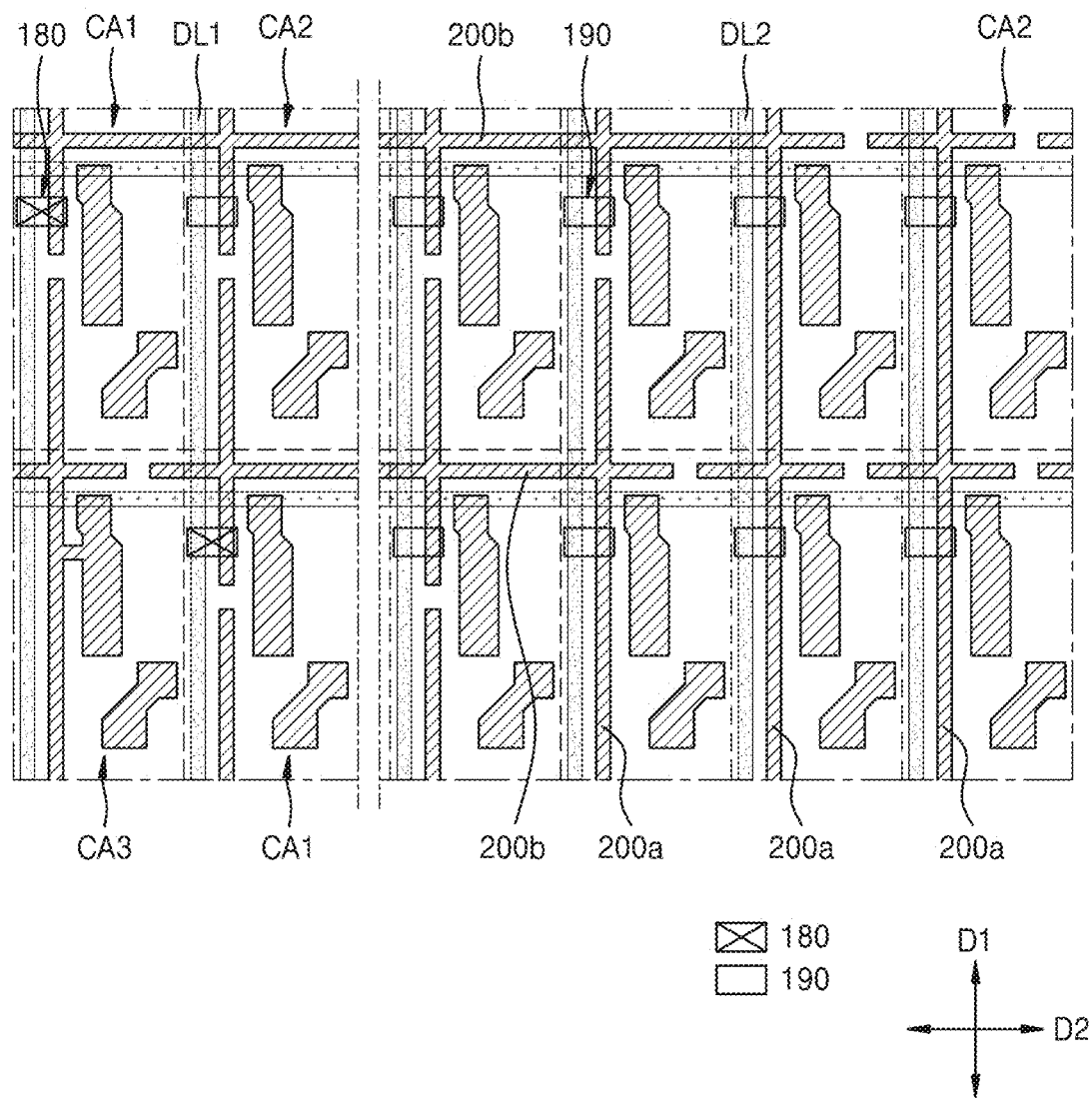
FIG. 12 is a diagram illustrating an exemplary embodiment of a first wire for each pixel area.
Figure 13A:
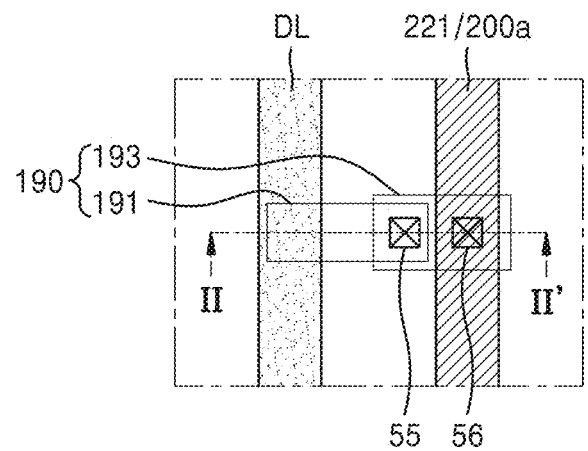
FIGS. 13AA through 13DB are enlarged plan views and cross-sectional views of a bridge of a second pixel area.
Figure 13A:
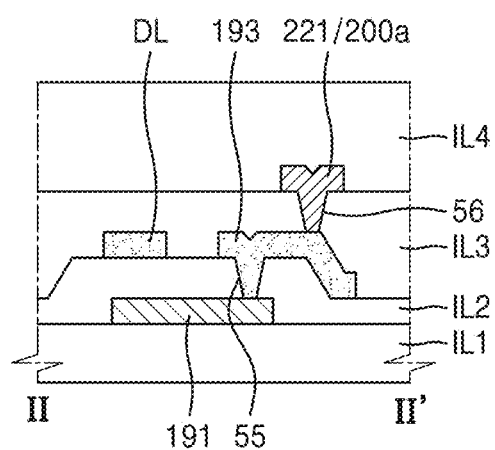

FIG. 12 is a diagram illustrating an exemplary embodiment of a first wire 200 for each pixel area. FIGS. 13AA through 13DB are enlarged plan views and cross-sectional views of a bridge of a second pixel area CA2. FIGS. 13AA, 13BA, 13CA and 13DA are plan views of the bridge, and FIGS. 13AB, 13BB, 13CB and 13DB are cross-sectional views of the bridge taken along line II-II'.

Referring to FIG. 12, in each of the first pixel areas CA1, the first wire 200 may be electrically connected to the first data line DL1 at the contact portion by the first bridge 180. The structure of the contact portion is the same as that described with reference to FIG. 10, and is thus omitted.

In each of the second pixel areas CA2, a second bridge 190 may be arranged at a position corresponding to that of the first bridge 180 in the first pixel area CA1. In each of the second pixel areas CA2, the second bridge 190 disposed between the first wire 200 and the first data line DL1 or the second data line DL2 does not electrically connect the first wire 200 to the first data line DL1 or the second data line DL2. Although the second bridge 190 may not be necessarily arranged in the third pixel areas CA3, in an exemplary embodiment, the second bridge 190 may be arranged in the third pixel areas CA3.

In an exemplary embodiment, as shown in FIGS. 13AA and 13AB, the second bridge 190 may include a third bridge electrode 191 and a fourth bridge electrode 193. Referring to the plan view and the cross-sectional view, the third bridge electrode 191 may be arranged on the insulating layer IL1, and the fourth bridge electrode 193 may be arranged on the insulating layer IL2 on the insulating layer IL1. The first wire 200, that is, the second branch 221 and the first portion 200a of the first wire 200, may be arranged on the insulating layer IL3 on the insulating layer IL2. The data line DL in FIGS. 13AA through 13DB may be the first data line DL1 or the second data line DL2. The data line DL at least partially overlaps the third bridge electrode 191, but does not contact the third bridge electrode 191. The fourth bridge electrode 193 may at least partially overlap the third bridge electrode 191, and may contact the third bridge electrode 191 via a contact hole 55 of the insulating layer IL2. The second branch 221 or the first portion 200a of the first wire 200 may at least partially overlap the fourth bridge electrode 193, and may contact the fourth bridge electrode 193 via a contact hole 56 of the insulating layer IL3. In FIGS. 13AA and 13AB, the contact hole 55 of the insulating layer IL2 does not overlap the contact hole 56 of the insulating layer IL3, but, in another exemplary embodiment, the contact hole 55 of the insulating layer IL2 may overlap the contact hole 56 of the insulating layer IL3. The first wire 200 may be covered with the insulating layer IL4 which is a planarization layer.

In an exemplary embodiment, the third bridge electrode 191 may be arranged in the same layer as the first bridge electrode 181. That is, the third bridge electrode 191 may be arranged in the same layer as the gate electrode GE of the thin-film transistor TFT shown in FIG. 5. The third bridge electrode 191 may include the same material as that of the gate electrode GE. In this case, the insulating layer IL1 may be the first insulating layer 111 shown in FIG. 5, and the insulating layer IL2 may have a structure in which the second insulating layer 112 and the third insulating layer 113 shown in FIG. 5 are stacked. In another exemplary embodiment, the third bridge electrode 191 may be arranged in the same layer as the upper electrode UE of the capacitor Cst shown in FIG. 5. The third bridge electrode 191 may include the same material as that of the upper electrode UE. In this case, the insulating layer IL1 may be the second insulating layer IL2 shown in FIG. 5, and the insulating layer IL2 may be the third insulating layer 113 shown in FIG. 5.

The fourth bridge electrode 193 may be arranged in the same layer as the second bridge electrode 183. The fourth bridge electrode 193 may include the same material as that of the second bridge electrode 183. The insulating layer IL3 may be the fourth insulating layer 114 shown in FIG. 5, and the insulating layer IL4 may be the fifth insulating layer 115 shown in FIG. 5.

Figure 13B:
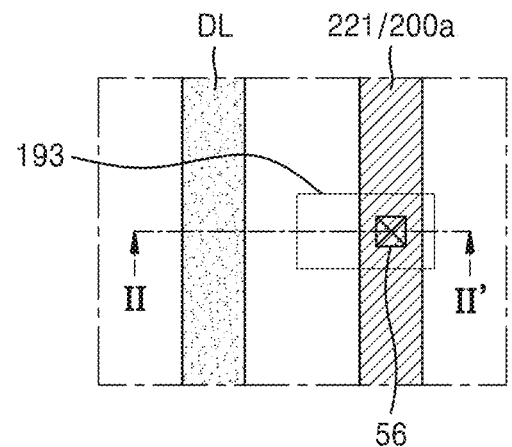
Figure 13B:
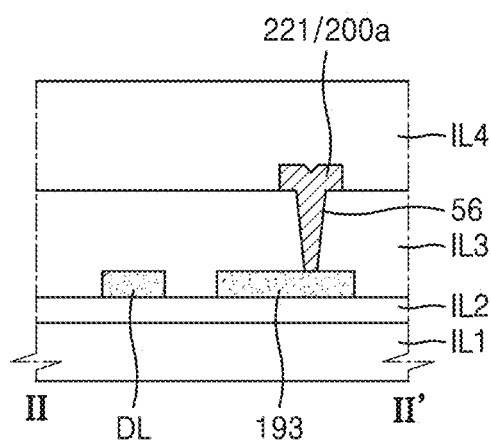
Figure 13C:
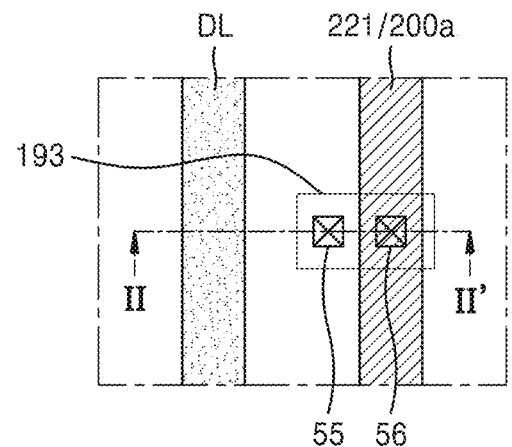
Figure 13C:
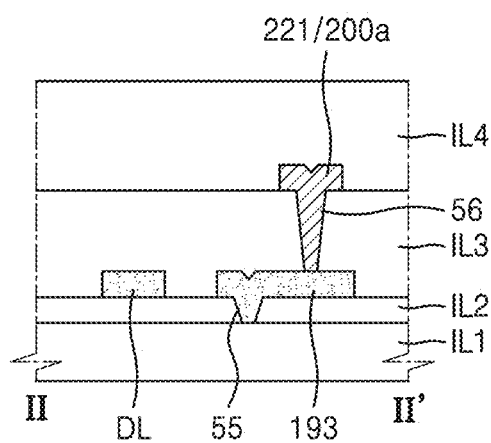
Figure 13D:
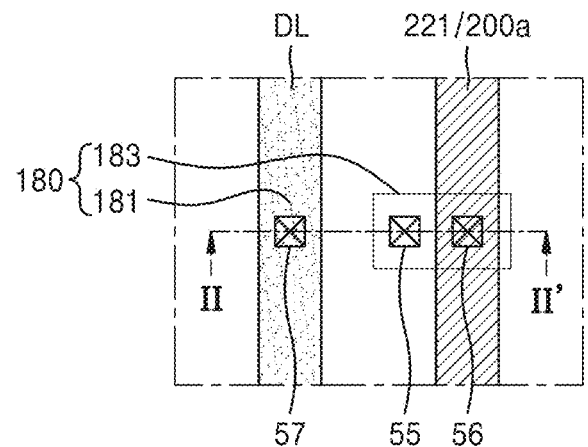
Figure 13D:
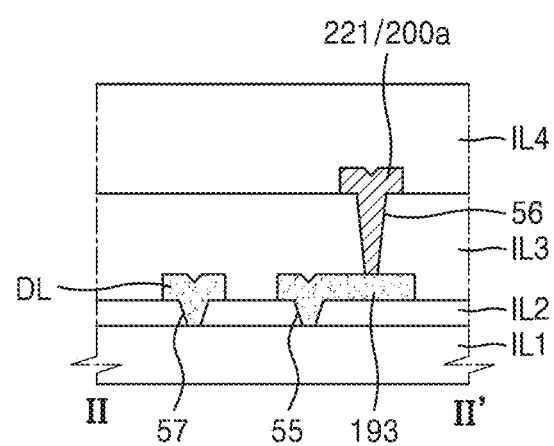

In another exemplary embodiment, as shown in FIGS. 13BA through 13DB, in the second pixel area CA2, the second bridge 190 may include only the fourth bridge electrode 193. Referring to the plan view and the cross-sectional view, the second branch 221 or the first portion 200a of the first wire 200 may at least partially overlap the fourth bridge electrode 193, and may contact the fourth bridge electrode 193 via the contact hole 56 of the insulating layer IL3. The first wire 200 may be covered with the insulating layer IL4 which is a planarization layer. In this case, in the second pixel area CA2, at least one of a contact hole 57 overlapping the data line DL and the contact hole 55 overlapping the fourth bridge electrode 193 may be defined in the insulating layer IL2. As shown in FIGS. 13CA and 13CB, the contact hole 55 may be defined in the insulating layer IL2 in the second pixel area CA2 simultaneously with the process of defining the contact hole 52 (refer to FIG. 10) of the insulating layer IL2 in the first pixel area CA1. The fourth bridge electrode 193 may fill the contact hole 55. In an alternative exemplary embodiment, as shown in FIGS. 13DA and 13DB, the contact holes 55 and 57 may be defined in the insulating layer IL2 in the second pixel area CA2 simultaneously with the process of defining the contact holes 51 and 52 (refer to FIG. 10) of the insulating layer IL2 in the first pixel area CA1. The data line DL may fill the contact hole 57, and the fourth bridge electrode 193 may fill the contact hole 55.

In the exemplary embodiment of FIG. 12 in which the second bridge 190 of FIGS. 13AA through 13DB is applied to the second pixel area CA2, the first wire 200 may be electrically connected to the second bridge electrode 183 below the first wire 200 through the contact hole 53 of the insulating layer IL3 in each first pixel area CA1, and may be electrically connected to the fourth bridge electrode 193 below the first wire 200 through the contact hole 56 of the insulating layer IL3 in each second pixel area CA2. That is, a part of the first wire 200 may be electrically connected to a bridge electrode below the first wire 200 equally in the first pixel areas CA1 and the second pixel areas CA2. Accordingly, the first pixel areas CA1 and the second pixel areas CA2 may be prevented from being distinguishably seen.

Figure 14:
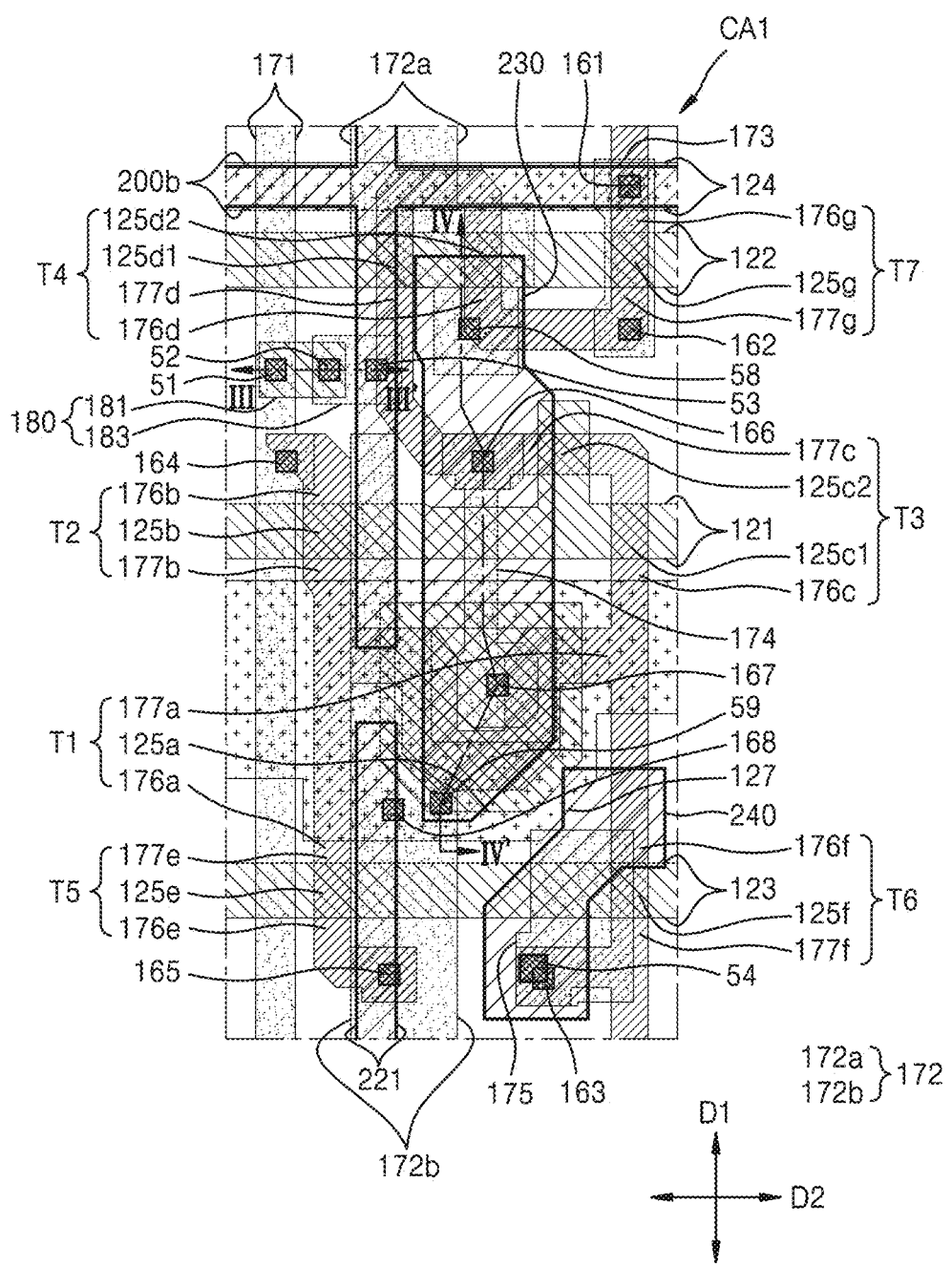
FIG. 14 is a schematic plan view illustrating an exemplary embodiment of positions of a pixel circuit and wires arranged in a first pixel area.
Figure 15:
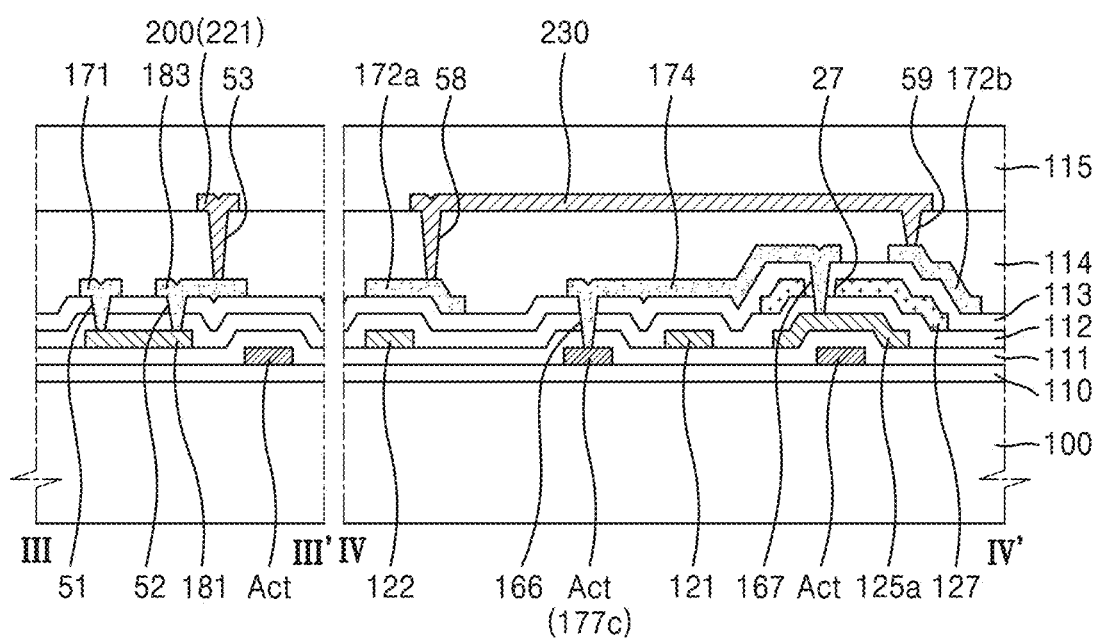
FIG. 15 is a cross-sectional view of the pixel circuit taken along lines III-III' and IV-IV' of FIG. 14.
Figure 16A:
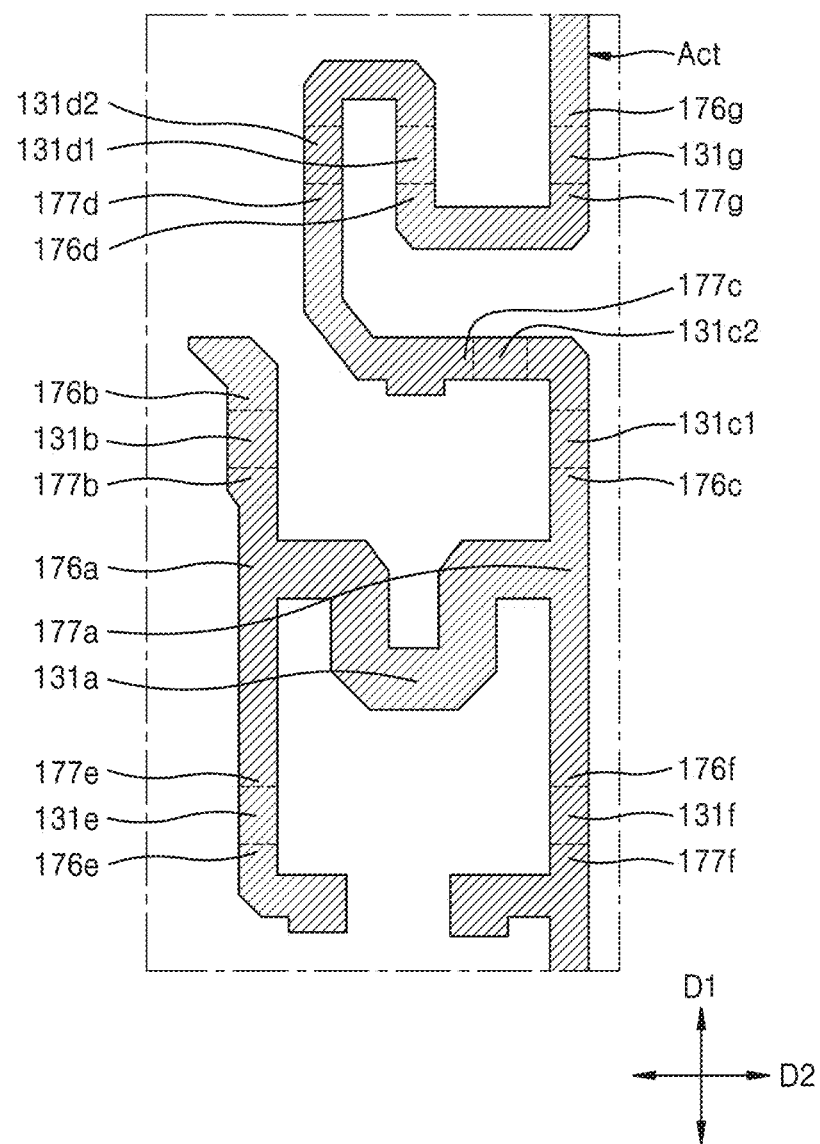
FIGS. 16A through 16E are schematic plan views illustrating elements of FIG. 14 by layer.
Figure 17:
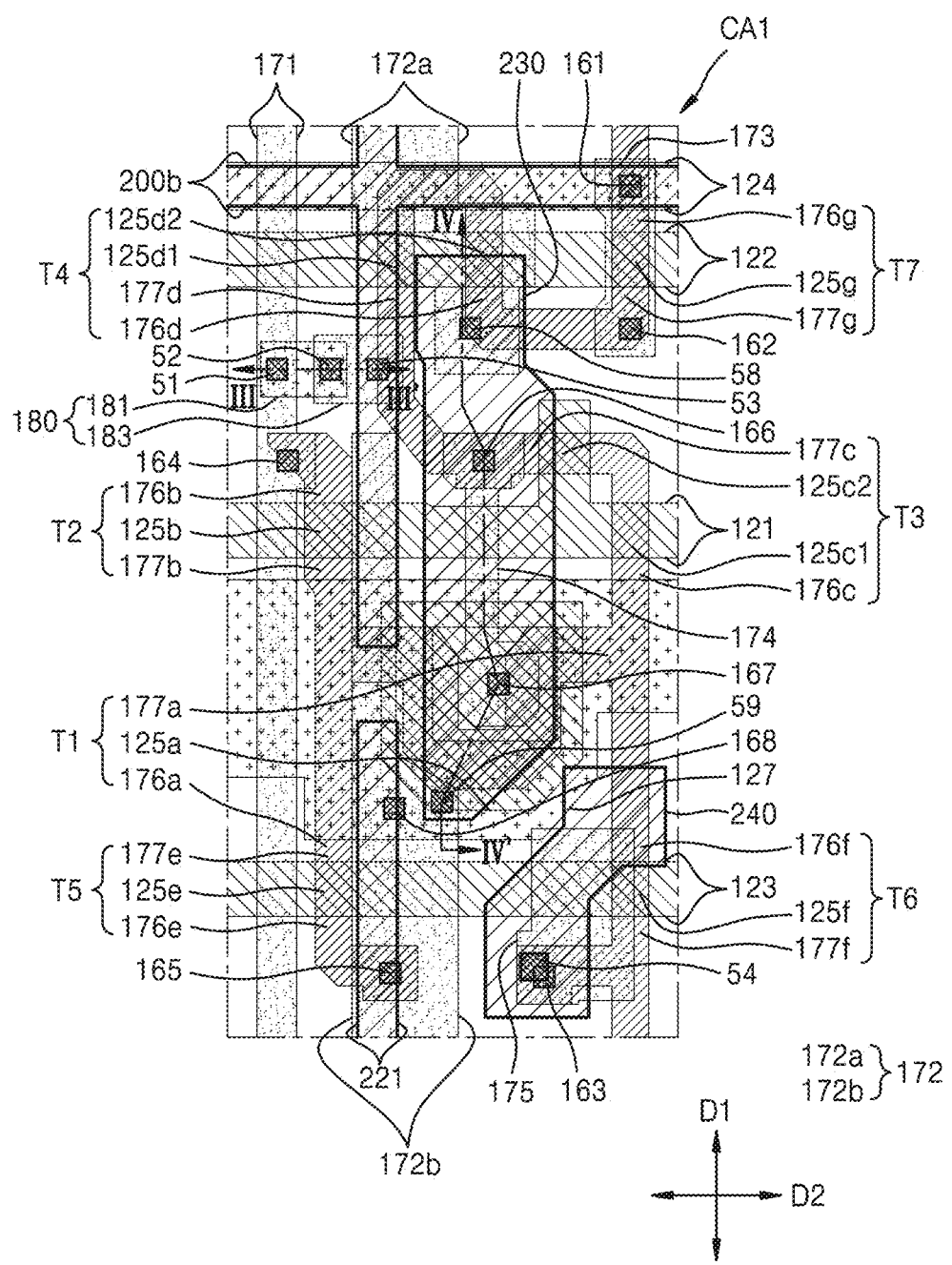
FIG. 17 is a schematic plan view illustrating an exemplary embodiment of positions of a pixel circuit and wires arranged in a first pixel area.
Figure 18:
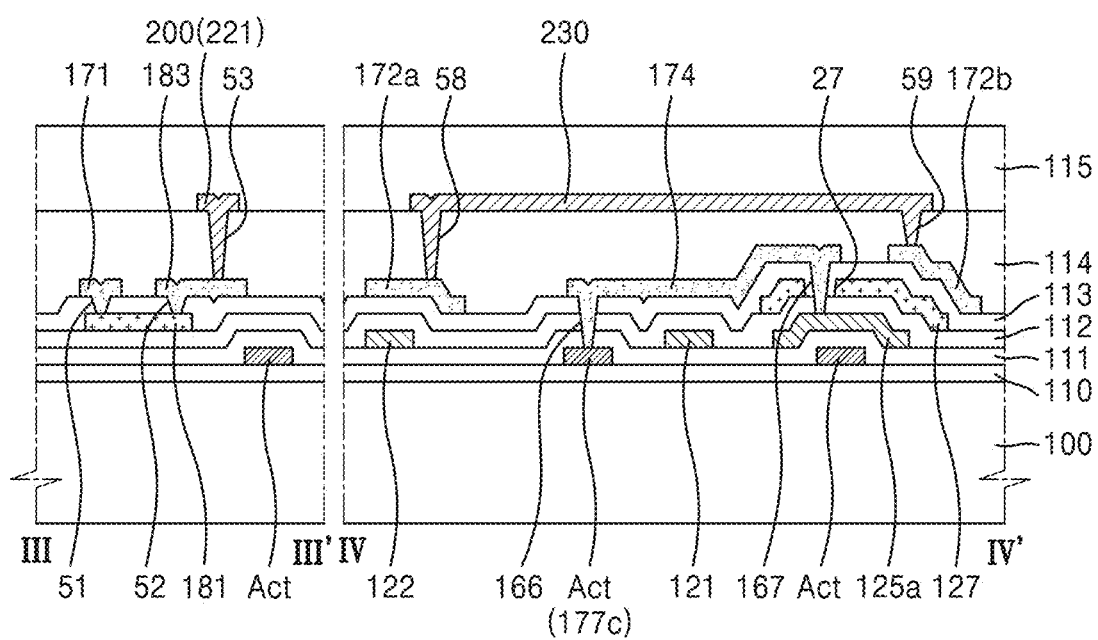
FIG. 18 is a cross-sectional view of the pixel circuit taken along lines III-III' and IV-IV' of FIG. 17.

FIG. 14 is a schematic plan view illustrating an exemplary embodiment of positions of a pixel circuit and wires arranged in a first pixel area. FIG. 15 is a cross-sectional view of the pixel circuit taken along lines III-III' and IV-IV' of FIG. 14. FIGS. 16A through 16E are schematic plan views illustrating elements of FIG. 14 by layer. FIG. 17 is a schematic plan view illustrating positions of a pixel circuit and wires arranged in a first pixel area according to another exemplary embodiment, and FIG. 18 is a cross-sectional view of the pixel circuit taken along lines III-III' and IV-IV' of FIG. 17.

FIG. 14 may correspond to the plan view of the pixel shown in FIG. 4B. The first through seventh transistors T1 through T7 shown in FIG. 4B may be implemented as thin-film transistors.

Referring to FIGS. 14 and 15, in the first pixel area CA1, the first wire 200 may be electrically connected to a data line 171. The data line 171 may be the first data line DL1. The first bridge 180 for electrically connecting the second branch 221 to the data line 171 may be arranged between the data line 171 and the second branch 221 protruding from the second portion 200b of the first wire 200. Hereinafter, detailed description of the same elements as those shown in FIG. 5 will be omitted.

The semiconductor layer Act may be disposed on the buffer layer 110 of the substrate 100. The semiconductor layer Act may be bent in various shapes. As shown in FIG. 16A, the semiconductor layer Act may include a channel area 131$a$ of the first transistor T1, a channel area 131$b$ of the second transistor T2, channel areas 131$c$1 and 131$c$2 of the third transistor T3, channel areas 131$d$1 and 131$d$2 of the fourth transistor T4, a channel area 131$e$ of the fifth transistor T5, a channel area 131$f$ of the sixth transistor T6, and a channel area 131$g$ of the seventh transistor T7. That is, each channel area of the first through seventh transistors T1 through T7 may be a partial area of the semiconductor layer Act. The channel area 131$a$ of the first transistor T1 may be provided long by having curves, such that a driving range of the gate voltage applied to the gate electrode may be widened. The channel area 131$a$ of the first transistor T1 may have various shapes such as '⊏,' ' ⇄ ,' 'S,' 'M,' 'W,' etc., in various exemplary embodiments. The channel area 131$g$ of the seventh transistor T7 may be a partial area of the semiconductor layer Act extending from a previous row. That is, the seventh transistor T7 of the FIG. 14 may be a seventh transistor T7 of a pixel in the previous row.

The semiconductor layer Act of the first through seventh transistors T1 through T7 may respectively include a source area and a drain area on both sides of the channel area. As shown in FIG. 16A, the semiconductor layer Act may include a source area 176$a$ and a drain area 177$a$ of the first transistor T1, a source area 176$b$ and a drain area 177$b$ of the second transistor T2, a source area 176$c$ and a drain area 177$c$ of the third transistor T3, a source area 176$d$ and a drain area 177$d$ of the fourth transistor T4, a source area 176$e$ and a drain area 177$e$ of the fifth transistor T5, a source area 176$f$ and a drain area 177$f$ of the sixth transistor T6, and a source area 176$g$ and a drain area 177$g$ of the seventh transistor T7. In some cases, the source area or the drain area may be interpreted as a source electrode or a drain electrode of a transistor. That is, for example, a source electrode and a drain electrode of the first transistor T1 may respectively correspond to the source area 176$a$ and the drain electrode 177$a$ doped with impurities in the vicinity of the channel area 131$a$ in the semiconductor layer Act shown in FIG. 16A. In some exemplary embodiments, positions of the source area and the drain area may be changed. The first insulating layer 111 may be disposed on the semiconductor layer Act.

Figure 16B:
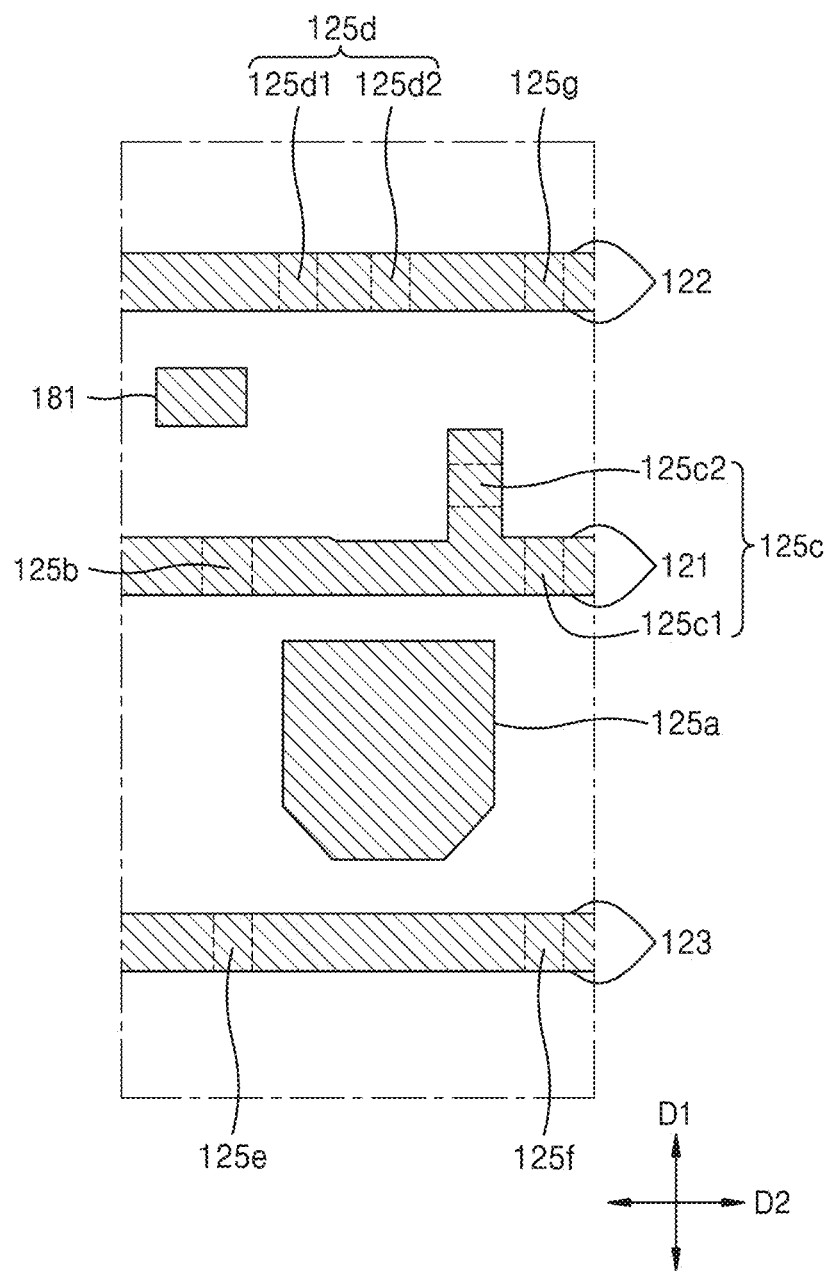

As shown in FIG. 16B, a gate electrode 125$a$ of the first transistor T1, a gate electrode 125$b$ of the second transistor T2, a gate electrode 125$c$ including gate electrodes 125$c$1 and 125$c$2 of the third transistor T3, a gate electrode 125$d$ including gate electrodes 125$d$1 and 125$d$2 of the fourth transistor T4, a gate electrode 125e of the fifth transistor T5, a gate electrode 125f of the sixth transistor T6, and a gate electrode 125g of the seventh transistor T7 may be arranged on the first insulating layer 111. Also, on the first insulating layer 111, a first scan line 121, a second scan line 122, and an emission control line 123 may include the same material and be disposed in the same layer as the gate electrodes of the first through seventh transistors T1 through T7, and may be arranged to extend in the second direction D2. The gate electrode 125a of the first transistor T1 may function as a lower electrode 125a of the capacitor Cst.

The gate electrode 125b of the second transistor T2 and the gate electrodes 125c1 and 125c2 of the third transistor T3 may be portions of the first scan line 121 crossing the semiconductor layer Act, or portions protruding from the first scan line 121. The gate electrodes 125d1 and 125d2 of the fourth transistor T4 and the gate electrode 125g of the seventh transistor T7 may be portions of the second scan line 122 crossing the semiconductor layer Act, or portions protruding from the second scan line 122. The gate electrode 125e of the fifth transistor T5 and the gate electrode 125f of the sixth transistor T6 may be portions of the emission control line 123 crossing the semiconductor layer Act, or portions protruding from the emission control line 123. The gate electrode 125a of the first transistor T1 may be of an island type.

The gate electrodes of the first through seventh transistors T1 through T7 may have a single-layer or multi-layer structure including at least one material from among Al, Pt, Pd, Ag, Mg, Au, Ni, Nd, Ir, Cr, Li, Ca, Mo, Ti, W, and Cu.

The first bridge electrode 181 may be further arranged on the first insulating layer 111. The first bridge electrode 181 may include the same material as that of the gate electrodes of the first through seventh transistors T1 through T7.

The second insulating layer 112 may be arranged on the gate electrodes of the first through seventh transistors T1 through T7 and the first bridge electrode 181.

Figure 16C:
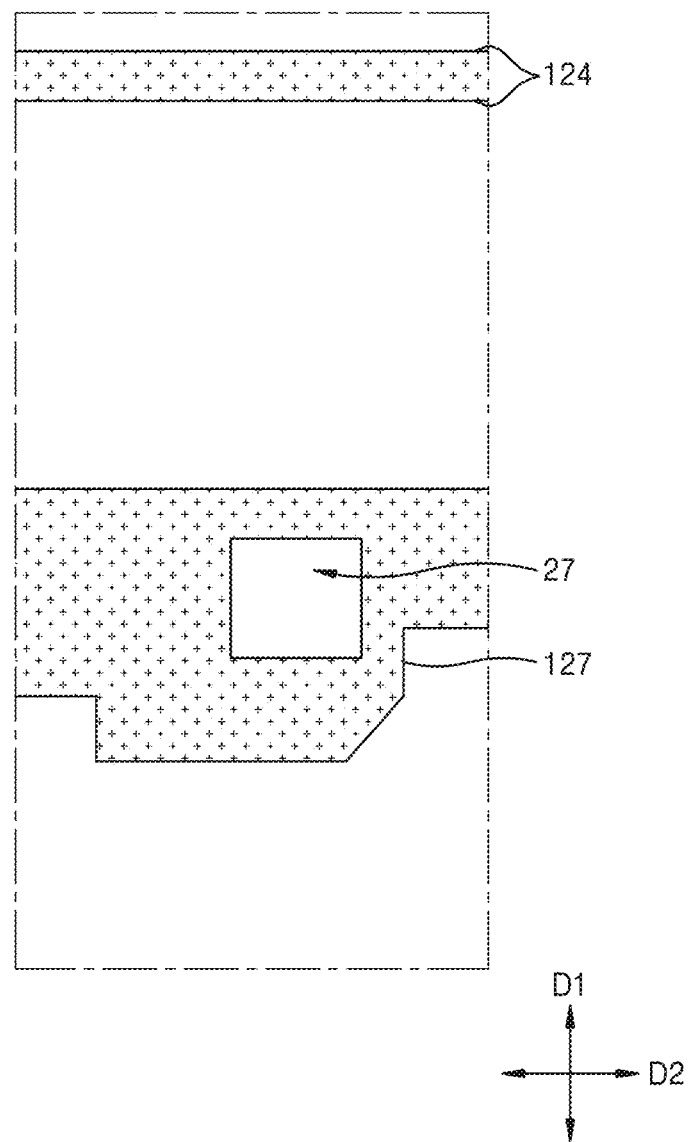

As shown FIG. 16C, an upper electrode 127 of the capacitor Cst may be arranged on the second insulating layer 112. An opening 27 may be defined in the upper electrode 127 of the capacitor Cst. A node electrode 174 may allow the lower electrode 125a of the capacitor Cst to be electrically connected to the drain area 177c of the third transistor T3. The upper electrode 127 of the capacitor Cst may have a single-layer or multi-layer structure including at least one material from among Al, Pt, Pd, Ag, Mg, Au, Ni, Nd, Ir, Cr, Li, Ca, Mo, Ti, W, and Cu.

An initialization voltage line 124 may be arranged on the second insulating layer 112 in the same layer as the upper electrode 127 of the capacitor Cst. The initialization voltage line 124 may include the same material as that of the upper electrode 127 of the capacitor Cst. The initialization voltage line 124 may extend in the second direction D2.

The third insulating layer 113 may be arranged on the upper electrode 127 of the capacitor Cst and the initialization voltage line 124.

Each of the first insulating layer 111, the second insulating layer 112, and the third insulating layer 113 may be an inorganic insulating layer including an inorganic material such as silicon oxide, silicon nitride, and/or silicon oxynitride.

Figure 16D:
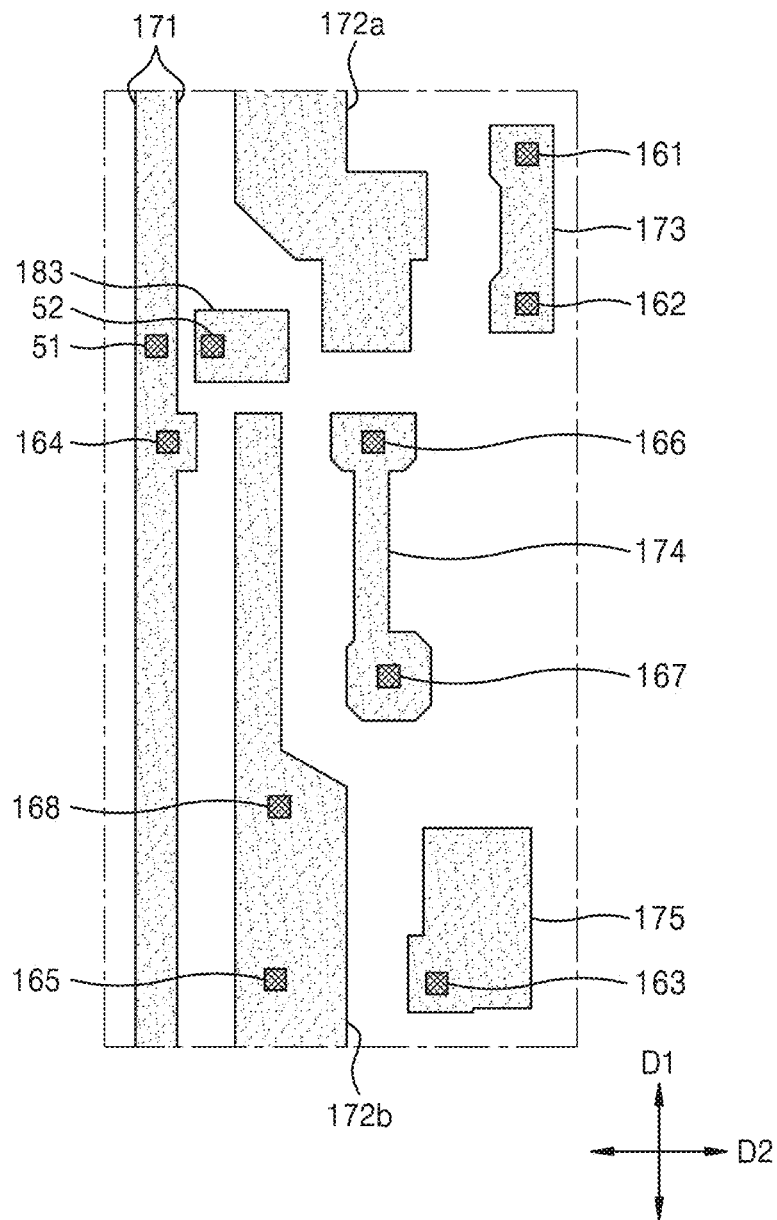

As shown in FIG. 16D, the data line 171 and a power voltage line 172 may be arranged on the third insulating layer 113. The data line 171 may be connected to the source area 176b of the second transistor T2 through a contact hole 164 defined in each of the first insulating layer 111, the second insulating layer 112, and the third insulating layer 113. The data line 171 may be connected to the first bridge electrode 181 through the contact hole 51 defined in each of the second insulating layer 112 and the third insulating layer 113. The power voltage line 172 extending in the first direction D1 may include a first voltage line 172a and a second voltage line 172b spaced apart from each other. The second voltage line 172b of the power voltage line 172 may be connected to the source area 176e of the fifth transistor T5 through a contact hole 165 defined in each of the first insulating layer 111, the second insulating layer 112, and the third insulating layer 113. The second voltage line 172b of the power voltage line 172 may be connected to the upper electrode 127 of the capacitor Cst through a contact hole 168 defined in the third insulating layer 113. The second bridge electrode 183 of the first bridge 180 may be arranged in a gap between the first voltage line 172a and the second voltage line 172b. The second bridge electrode 183 may be connected to the first bridge electrode 181 through the contact hole 52 defined in each of the second insulating layer 112 and the third insulating layer 113.

Each of the data line 171, the power voltage line 172, and the second bridge electrode 183 may include Mo, Al, Cu, Ti, etc., and may have a single-layer or multi-layer structure. In an exemplary embodiment, the data line 171, the power voltage line 172, and the second bridge electrode 183 may have a multi-layer structure including Ti/Al/Ti.

Various conductive layers may be further disposed on the third insulating layer 113. In an exemplary embodiment, the node electrode 174 and connection members 173 and 175 may be provided on the third insulating layer 113, for example. One end of the node electrode 174 may be connected to the drain area 177c of the third transistor T3 and the drain area 177d of the fourth transistor T4 through a contact hole 166 defined in each of the first insulating layer 111, the second insulating layer 112, and the third insulating layer 113, and the other end of the node electrode 174 may be connected to the gate electrode 125a of the first transistor T1 through a contact hole 167 defined in each of the second insulating layer 112 and the third insulating layer 113. In this case, the other end of the node electrode 174 may be connected to the gate electrode 125a of the first transistor T1 through the opening 27 defined in the upper electrode 127 of the capacitor Cst. One end of the connection member 173 may be connected to the initialization voltage line 124 through a contact hole 161 defined in the third insulating layer 113, and the other end of the connection member 173 may be connected to the source area 176d of the fourth transistor T4 through a contact hole 162 defined in each of the first insulating layer 111, the second insulating layer 112, and the third insulating layer 113. The connection member 175 may be connected to the drain area 177f of the sixth transistor T6 through a contact hole 163 defined in each of the first insulating layer 111, the second insulating layer 112, and the third insulating layer 113.

Figure 16E:
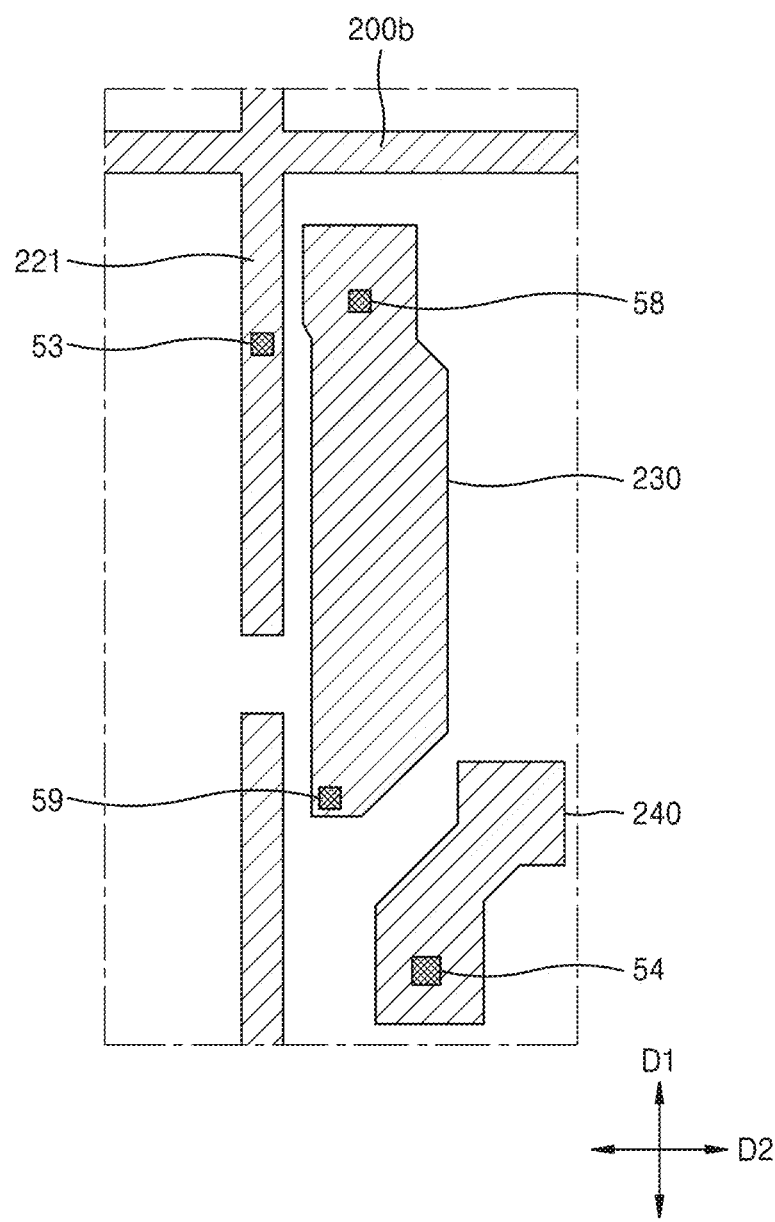

The fourth insulating layer 114 may be arranged on the data line 171 and the power voltage line 172. As shown in FIG. 16E, the first wire 200 may be arranged on the fourth insulating layer 114. FIG. 16E illustrates the second portion 200b and the second branch 221 of the first wire 200. The second branch 221 of the first wire 200 may be connected to the second bridge electrode 183 through the contact hole 53 of the fourth insulating layer 114. Accordingly, the first wire 200 may be electrically connected to the data line 171 through the first bridge electrode 181 and the second bridge electrode 183.

The first pattern 230 and the second pattern 240 may be further arranged on the fourth insulating layer 114. The first pattern 230 may be connected to the first voltage line 172a of the power voltage line 172 through a contact hole 58 of the fourth insulating layer 114. The first pattern 230 may be connected to the second voltage line 172b of the power voltage line 172 through a contact hole 59 of the fourth insulating layer 114. The first voltage line 172a and the second voltage line 172b that are spaced apart from each other may be electrically connected to each other by the first pattern 230. Because the second voltage line 172b is connected to the upper electrode 127 of the capacitor Cst extending in the second direction D2, the power voltage line 172 may have a mesh structure. The second pattern 240 may be connected to the connection member 175 through a contact hole 54 of the fourth insulating layer 114. The second pattern 240 may be connected to the pixel electrode PE through a contact hole of the fifth insulating layer 115. That is, the thin-film transistor and the pixel electrode PE may be electrically connected to each other by the connection member 175 and the second pattern 240. The second pattern 240 may function as the connection member 150 shown in FIG. 5.

Each of the first wire 200, the first pattern 230, and the second pattern 240 may include Mo, Al, Cu, Ti, etc., and may have a single-layer or multi-layer structure. In an exemplary embodiment, the first wire 200, the first pattern 230, and the second pattern 240 may have a multi-layer structure including Ti/Al/Ti.

Each of the fourth insulating layer 114 and the fifth insulating layer 115 that is a planarization insulating layer may be an organic insulating layer. As shown in FIG. 5, the organic light-emitting diode OLED that is a display element may be arranged on the fifth insulating layer 115.

In FIGS. 14 and 15, the first bridge electrode 181 of the first bridge 180 may include the same material and be disposed in the same layer as the gate electrodes of the transistor. In another exemplary embodiment, as shown in FIGS. 17 and 18, the first bridge electrode 181 may be arranged on the second insulating layer 112 in the same layer as the upper electrode 127 of the capacitor Cst. The first bridge electrode 181 may include the same material as that of the upper electrode 127 of the capacitor Cst. The data line 171 may be connected to the first bridge electrode 181 through the contact hole 51 defined in the third insulating layer 113. The second bridge electrode 183 may be connected to the first bridge electrode 181 through the contact hole 52 defined in the third insulating layer 113.

Figure 19:
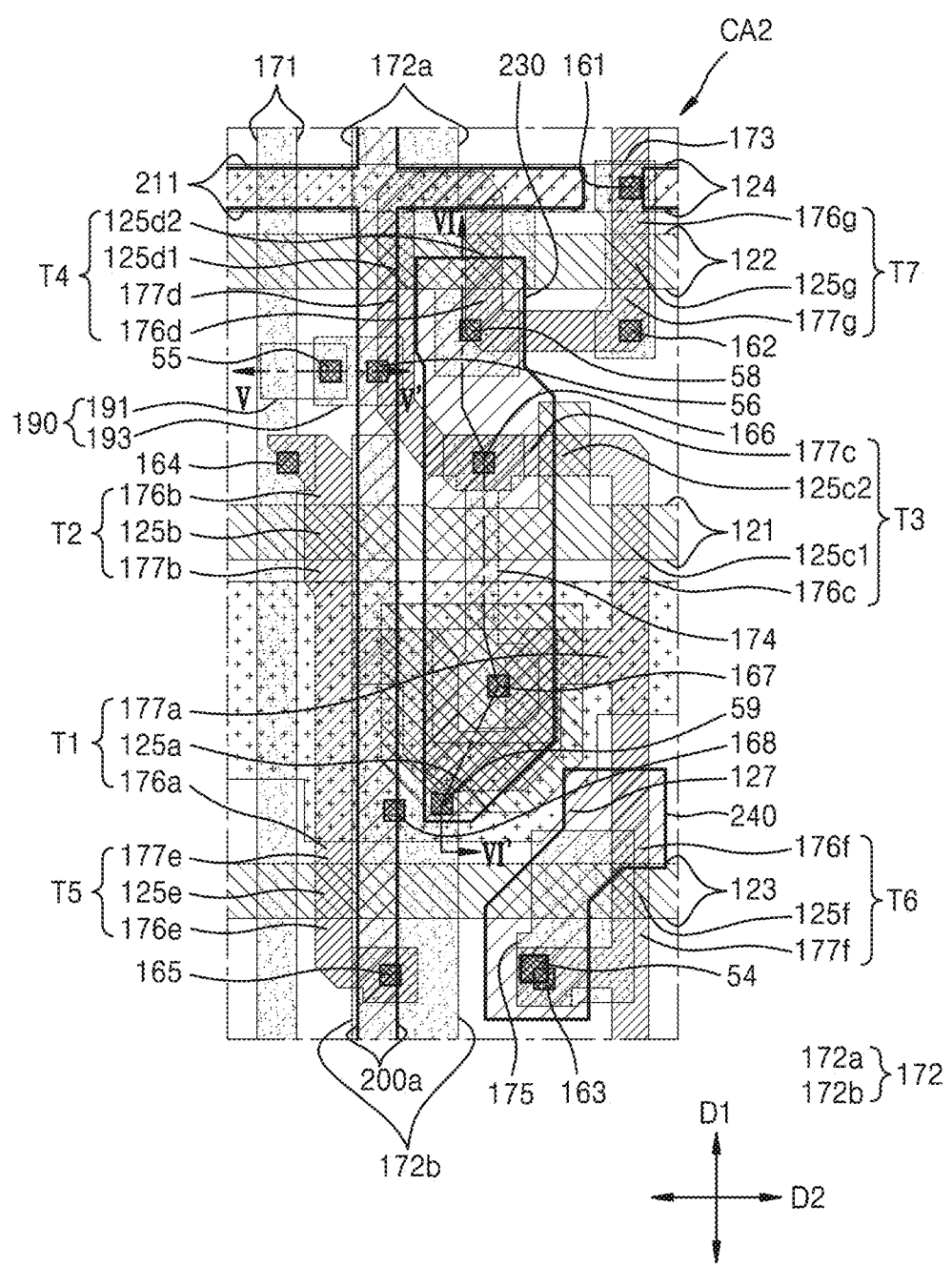
FIG. 19 is a schematic plan view illustrating an exemplary embodiment of positions of a pixel circuit and wires arranged in a second pixel area.
Figure 20:
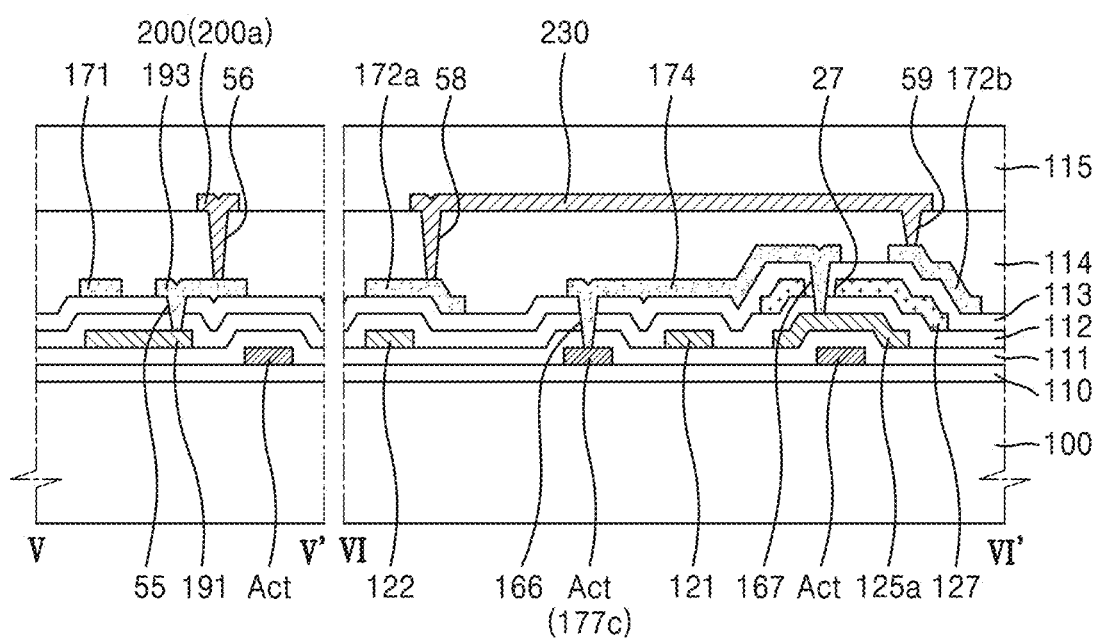
FIGS. 20 and 21 are cross-sectional views of the pixel circuit taken along lines V-V' and VI-VI' of FIG. 19.
Figure 21:
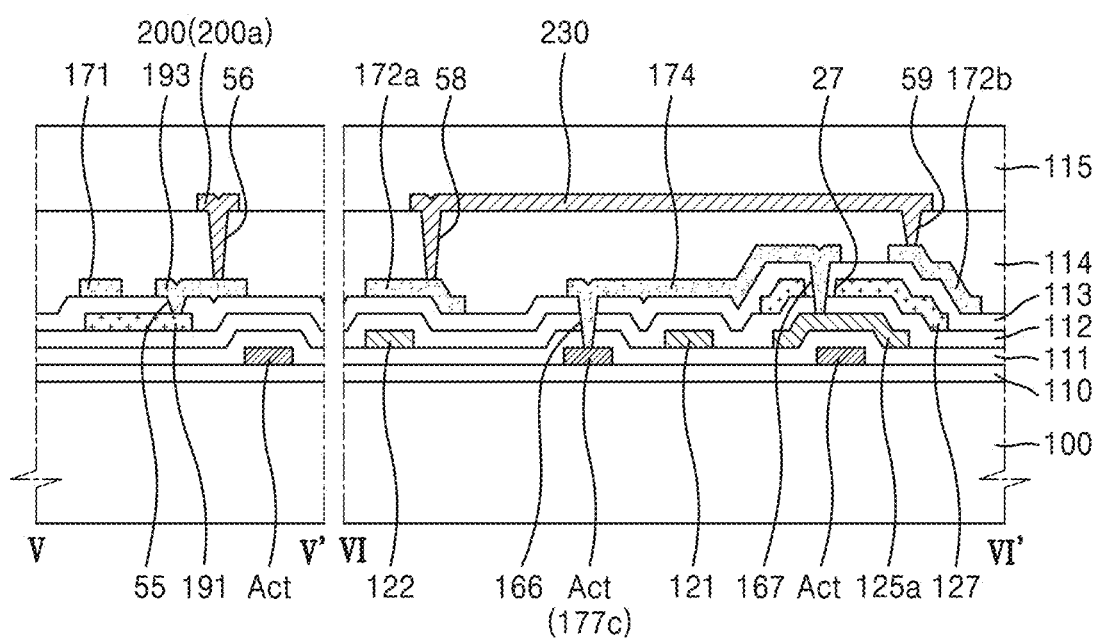

FIG. 19 is a schematic plan view illustrating an exemplary embodiment of positions of a pixel circuit and wires arranged in a second pixel area. FIGS. 20 and 21 are cross-sectional views of the pixel circuit taken along lines V-V and VI-VI' of FIG. 19. Hereinafter, different elements from FIG. 14 are mainly described. FIG. 19 illustrates the second pixel area CA2 where the first portion 200a of the first wire 200 is disposed.

Referring to FIGS. 19 and 20, the second bridge 190 may be arranged in the second pixel area CA2 to correspond to the position where the first bridge 180 of the first pixel area CA1 is arranged. The second bridge 190 may include the third bridge electrode 191 and the fourth bridge electrode 193. The data line 171 may be the second data line DL2. The third bridge electrode 191 may be arranged on the first insulating layer 111. The third bridge electrode 191 may include the same material as that of the gate electrodes of the first through seventh transistors T1 through T7. The data line 171 may be arranged on the third insulating layer 113 and may at least partially overlap the third bridge electrode 191. The fourth bridge electrode 193 of the second bridge 190 may be arranged in a gap between the first voltage line 172a and the second voltage line 172b of the power voltage line 172 that are spaced apart from each other. The fourth bridge electrode 193 may at least partially overlap the third bridge electrode 191, and may be connected to the third bridge electrode 191 through the contact hole 55 defined in each of the second insulating layer 112 and the third insulating layer 113. The first wire 200 may be disposed on the fourth insulating layer 114. FIG. 19 illustrates the first portion 200a and the first branch 211 of the first wire 200. The first portion 200a of the first wire 200 may be connected to the fourth bridge electrode 193 through the contact hole 56 of the fourth insulating layer 114.

In FIGS. 19 and 20, the third bridge electrode 191 of the second bridge 190 may include the same material and be disposed in the same layer as the gate electrodes of the transistor. In another exemplary embodiment, as shown in FIG. 21, the third bridge electrode 191 may be arranged on the second insulating layer 112 in the same layer as the upper electrode 127 of the capacitor Cst. The third bridge electrode 191 may include the same material as that of the upper electrode 127 of the capacitor Cst. The fourth bridge electrode 193 may be connected to the third bridge electrode 191 through the contact hole 55 defined in the third insulating layer 113.

Figure 22:
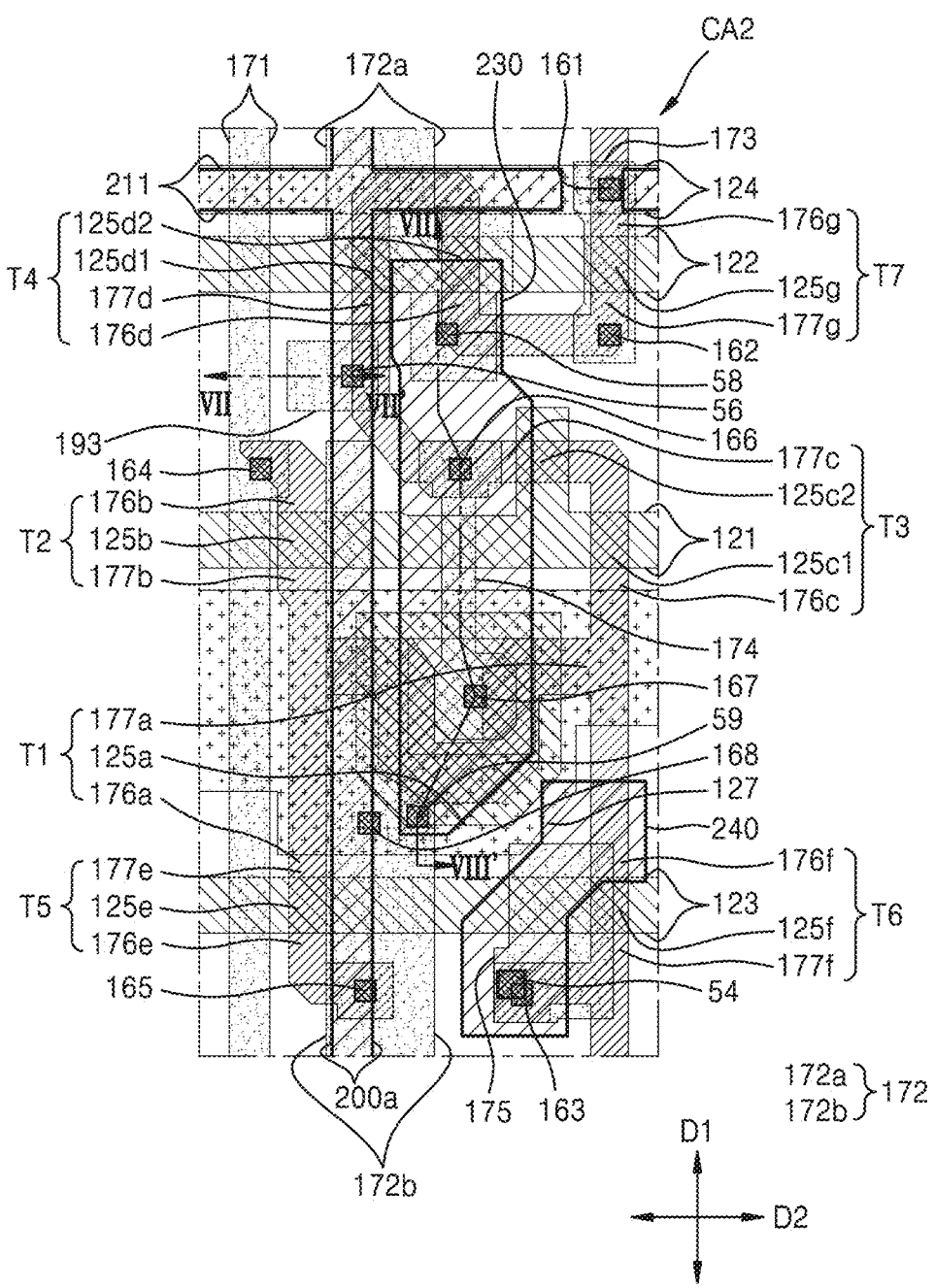
FIG. 22 is a schematic plan view illustrating an exemplary embodiment of positions of a pixel circuit and wires arranged in a second pixel area.
Figure 23:
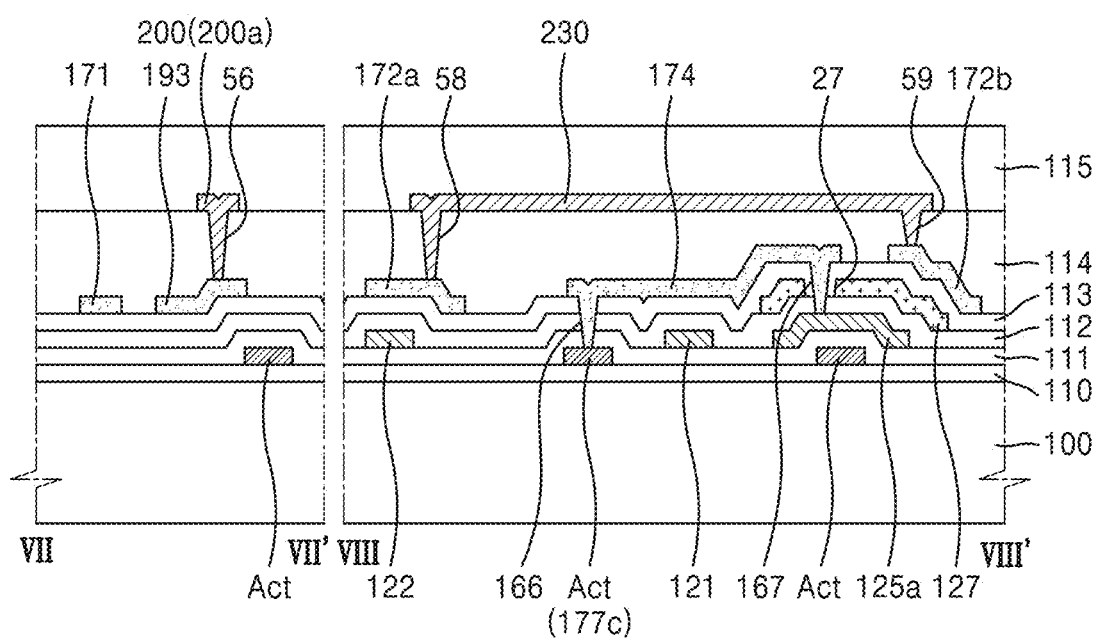
FIG. 23 is a cross-sectional view of the pixel circuit taken along lines VII-VII' and VIII-VIII' of FIG. 22.

FIG. 22 is a schematic plan view illustrating positions of a pixel circuit and wires arranged in a second pixel area according to another exemplary embodiment. FIG. 23 is a cross-sectional view of the pixel circuit taken along lines VII-VII' and VIII-VIII' of FIG. 22. Hereinafter, different elements from FIG. 19 are mainly described. FIG. 22 illustrates the second pixel area CA2 where the first portion 200a of the first wire 200 is disposed.

Referring to FIGS. 22 and 23, the second bridge 190 may be arranged in the second pixel area CA2 to correspond to the position where the first bridge 180 of the first pixel area CA1 is arranged. The second bridge 190 may include only the fourth bridge electrode 193. The data line 171 may be the second data line DL2. The fourth bridge electrode 193 of the second bridge 190 may be arranged in a gap between the first voltage line 172a and the second voltage line 172b of the power voltage line 172 that are spaced apart from each other. The first wire 200 may be disposed on the fourth insulating layer 114. FIG. 22 illustrates the first portion 200a and the first branch 211 of the first wire 200. The first portion 200a of the first wire 200 may be connected to the fourth bridge electrode 193 through the contact hole 56 of the fourth insulating layer 114.

In another exemplary embodiment, as shown in FIGS. 13CA and 13CB, the contact hole 55 may be defined in the third insulating layer 113 in the second pixel area CA2 simultaneously with the process of defining the contact hole 52 (refer to FIGS. 15 and 18) of the third insulating layer 113 in the first pixel area CA1. The fourth bridge electrode 193 may fill the contact hole 55. In an alternative exemplary embodiment, as shown in FIGS. 13DA and 13DB, the contact holes 55 and 57 may be defined in the third insulating layer 113 in the second pixel area CA2 simultaneously with the process of defining the contact holes 51 and 52 (refer to FIGS. 15 and 18) of the third insulating layer 113 in the first pixel area CA1. The data line 171 may fill the contact hole 57, and the fourth bridge electrode 193 may fill the contact hole 55.

The second bridge 190 in FIGS. 19 and 22 may be equally applied to the second pixel area CA2 where the second portion 200b of the first wire 200 is arranged.

Figure 24:
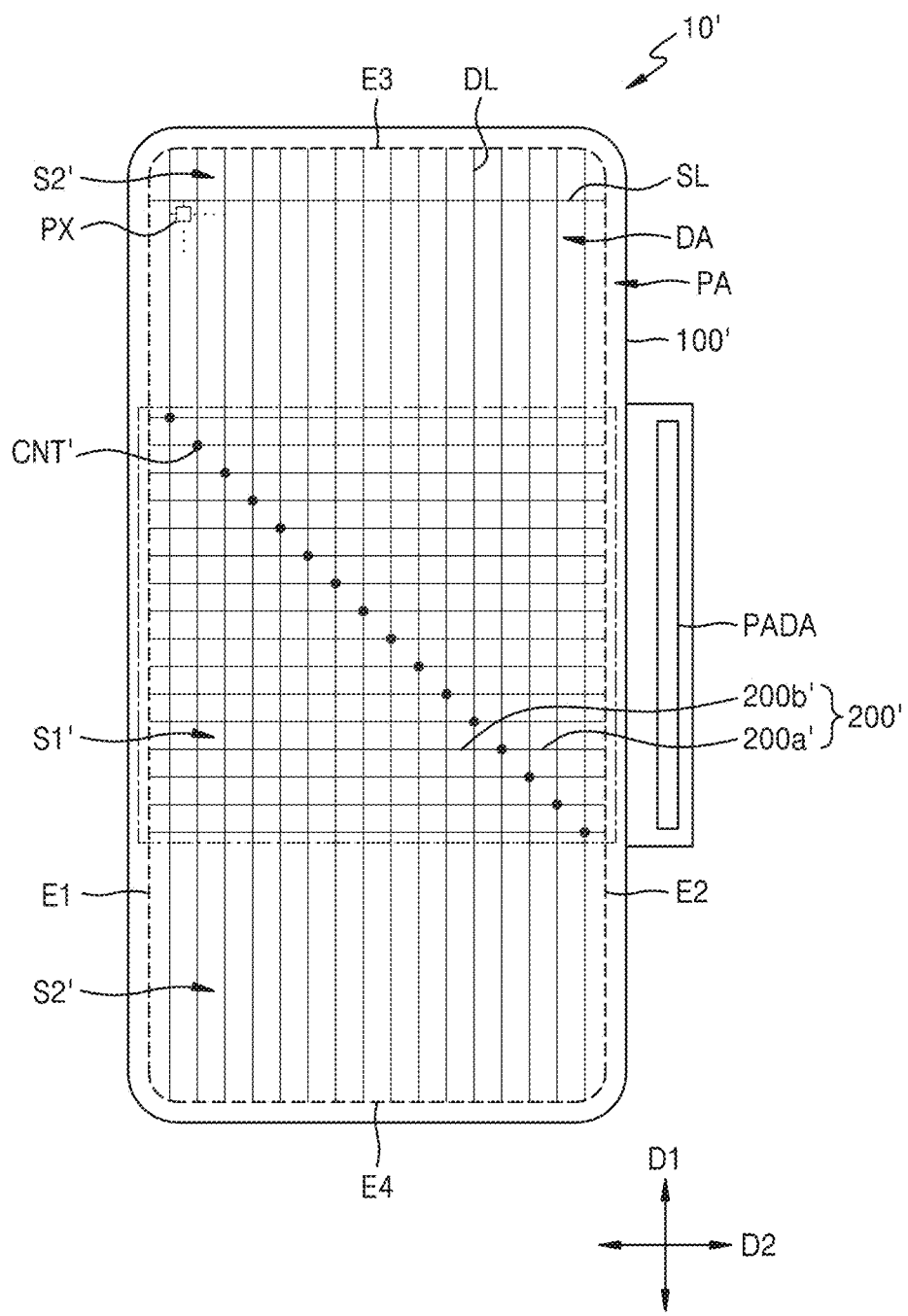
FIG. 24 is a schematic plan view of another exemplary embodiment of a display panel.

FIG. 24 is a schematic plan view of an exemplary embodiment of a display panel 10' according to another exemplary embodiment.

The display panel 10' shown in FIG. 24 may include a display area and a peripheral area disposed outside the display area. The display panel 10' may include a substrate 100' and the substrate 100' may include a display area DA and a peripheral area PA respectively corresponding to the display area and the peripheral area of the display panel 10'.

In the display panel 10' shown in FIG. 24, a pad area PADA is adjacent to a second edge E2 from among a first edge E1 through a fourth edge E4. Because a bending area is disposed between the pad area PADA and the display area DA, as the substrate 100' is bent, at least a part of the pad area PADA may overlap the display area DA.

A plurality of pixels PX and signal lines for applying an electrical signal to the plurality of pixels PX may be disposed in the display area DA. The signal lines may include a plurality of scan lines SL and a plurality of data lines DL. Each of the plurality of data lines DL may extend in the first direction D1, and each of the plurality of scan lines SL may extend in the second direction D2. First wires 200' for transferring an electrical signal applied from the pad area PADA to the signal lines connected to the pixels PX may be disposed in the display area DA. In an exemplary embodiment, the first wires 200' may be connected to the data lines DL and may transfer a data signal supplied from the pad area PADA to the data lines, for example. Each of the first wires 200' may be electrically connected to the corresponding data line DL at a contact portion CNT'. The first wires 200' may extend in the second direction D2 parallel to the scan lines SL. The first wires 200' may be disposed in layers different from the scan lines SL and the data lines DL of the pixels PX. Although not shown, a second wire connected to the first wire 200' may be further provided between the display area DA and the pad area PADA. The second wire may be a portion where the first wire 200' extends to the peripheral area PA, or a separate wire disposed on a layer different from the first wire 200'.

Each of the first wires 200' may include a first portion 200a' extending in the second direction D2 between the contact portion CNT' and the second edge E2, and a second portion 200b' extending in the second direction D2 between the contact portion CNT' and the first edge E1. A length of the first portion 200a' and a length of the second portion 200b' may vary depending on a position of the data line DL to which the first wire 200' is connected. As the data line DL is closer to the first edge E1, the first portion 200a' of the first wire 200' may be longer and the second portion 200b' may be shorter.

The display area DA may include a first area S1' where the first wire 200' is disposed and second areas S2' other than the first area S1'. The second areas S2' may face each other with the first area S1' therebetween. The arrangement of a pixel circuit and wires provided in pixel areas where the contact portion CNT' is disposed among pixel areas of the first area S1' and other pixel areas may be the same as the arrangement of the pixel circuit and the wires provided in the first pixel areas CA1 and the second pixel areas CA2 described with reference to the display panel 10 of FIG. 1 as an example. The arrangement of a pixel circuit and wires provided in pixel areas of the second area S2' may be the same as the arrangement of the pixel circuit and the wires provided in the third pixel areas CA3 described with reference to the display panel 10 of FIG. 1 as an example.

In exemplary embodiments of the invention, because connection wires for transferring a data signal to a data line are disposed in a display area, a dead area of a display device may be reduced. Also, because reflection characteristics are the same or similar over the entire display area, areas where the connection wires are disposed may be prevented from being distinguishably seen. However, the scope of the invention is not limited by the effects.

It should be understood that embodiments described herein should be considered in a descriptive sense only and not for purposes of limitation. Descriptions of features within each exemplary embodiment should typically be considered as available for other similar features in other exemplary embodiments. While one or more embodiments have been described with reference to the drawing figures, it will be understood by those of ordinary skill in the art that various changes in form and details may be made therein without departing from the spirit and scope as defined by the following claims.

What is claimed is:

1. A display device comprising:
   a data line extending in a first direction;
   a scan line extending in a second direction crossing the first direction;
   a wire extending in the second direction, the wire comprising a branch protruding from the wire in the first direction; and
   a bridge electrically connecting the wire to the data line,
   wherein the bridge overlaps the data line and the branch of the wire,
   wherein the bridge comprises:
      a first bridge electrode arranged on a lower layer of the data line and at least partially overlapping the data line, and electrically connected to the data line; and
      a second bridge electrode arranged in a same layer as the data line and at least partially overlapping the first bridge electrode and the branch of the wire, and electrically connected to the first bridge electrode and the branch of the wire,
   wherein the display device further comprises:
      an inorganic insulating layer between the first bridge electrode and the data line; and
      an organic insulating layer between the data line and the wire.

2. The display device of claim 1, further comprising a power line arranged in parallel with the data line, and including a first power line and a second power line spaced apart from each other.

3. The display device of claim 2, wherein the bridge is arranged in a gap between the first power line and the second power line.

4. The display device of claim 2, wherein the power line is arranged in a same layer as the data line.

5. The display device of claim 2, further comprising a conductive pattern electrically connecting the first power line to the second power line.

6. The display device of claim 5, wherein the conductive pattern is arranged in a same layer as the wire.

7. A display device comprising:
   a data line extending in a first direction;
   a scan line extending in a second direction crossing the first direction;
   a wire extending in parallel with the data line or the scan line and including a branch protruding in a direction perpendicular to an extension direction of the wire; and
   a bridge overlapping a part of the wire,
   wherein the bridge comprises:

a first bridge electrode arranged on a lower layer of the data line and at least partially overlapping the data line, and insulated from the data line; and a second bridge electrode arranged in a same layer as the data line and at least partially overlapping the first bridge electrode and the wire, and electrically connected to the first bridge electrode and the wire, wherein the display device further comprises:

an inorganic insulating layer between the first bridge electrode and the data line; and an organic insulating layer between the data line and the wire.

8. The display device of claim 7, further comprising a power line arranged in parallel with the data line, and including a first power line and a second power line spaced apart from each other.

9. The display device of claim 8, wherein the bridge is arranged in a gap between the first power line and the second power line.

10. The display device of claim 8, wherein the power line is arranged in a same layer as the data line.

11. The display device of claim 8, further comprising a conductive pattern electrically connecting the first power line to the second power line.

12. The display device of claim 11, wherein the conductive pattern is arranged in a same layer as the wire.

13. The display device of claim 7, wherein the bridge overlaps the branch protruding from the wire extending in parallel with the scan line or the wire extending in parallel with the data line.

14. A display device comprising:

a data line extending in a first direction;

a scan line extending in a second direction crossing the first direction;

a wire extending in parallel with the data line or the scan line and including a branch protruding in a direction perpendicular to an extension direction of the wire;

a bridge overlapping a part of the wire;

an inorganic insulating layer; and an organic insulating layer between the wire and the data line on the inorganic insulating layer, wherein the bridge comprises a bridge electrode arranged in a same layer as the data line and at least partially overlapping the wire, and electrically connected to the wire, and wherein the inorganic insulating layer includes at least one of a hole overlapping the data line and a hole overlapping the bridge electrode.

* * * * *